US009454319B2

(12) United States Patent
Stenfort

(10) Patent No.: US 9,454,319 B2
(45) Date of Patent: *Sep. 27, 2016

(54) STORAGE SYSTEM DATA HARDENING

(71) Applicant: Seagate Technology LLC, Cupertino, CA (US)

(72) Inventor: Ross John Stenfort, Los Altos, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/848,166

(22) Filed: Sep. 8, 2015

(65) Prior Publication Data
US 2016/0018999 A1    Jan. 21, 2016

Related U.S. Application Data

(63) Continuation of application No. 14/201,058, filed on Mar. 7, 2014, now Pat. No. 9,128,715, which is a continuation of application No. 13/260,709, filed as application No. PCT/US2010/028981 on Mar. 27, (Continued)

(51) Int. Cl.
*G06F 3/06*    (2006.01)
*G11C 5/14*    (2006.01)

(Continued)

(52) U.S. Cl.
CPC .......... *G06F 3/0619* (2013.01); *G06F 3/0607* (2013.01); *G06F 3/0625* (2013.01); *G06F 3/0634* (2013.01); *G06F 3/0659* (2013.01); *G06F 3/0661* (2013.01); *G06F 3/0685* (2013.01); *G06F 3/0688* (2013.01);

(Continued)

(58) Field of Classification Search
CPC ............... G06F 3/0661; G06F 3/0689; G06F 12/0246; G06F 3/0607; G06F 3/0625; G06F 3/0634; G06F 3/0659; G06F 3/0685; G06F 3/0688; G06F 1/30; G06F 3/0619; G11C 5/141; G11C 29/02; Y02B 60/1246
See application file for complete search history.

(56) References Cited

U.S. PATENT DOCUMENTS

| 6,173,360 | B1 | 1/2001 | Beardsley et al. | |
|---|---|---|---|---|
| 2005/0108452 | A1* | 5/2005 | Loffink | G06F 3/0607 710/74 |
| 2006/0259684 | A1* | 11/2006 | Abe | G06F 11/1435 711/113 |
| 2007/0005815 | A1 | 1/2007 | Boyd et al. | |
| 2007/0234117 | A1* | 10/2007 | Elliott | G06F 3/0619 714/22 |

(Continued)

FOREIGN PATENT DOCUMENTS

WO    WO2010111694    9/2010

OTHER PUBLICATIONS

Stenfort, Ross; International Preliminary Report on Patentability for PCT/US2010/028981, filed Mar. 27, 2010, mailed Sep. 27, 2011, 4 pgs.

(Continued)

*Primary Examiner* — Hashem Farrokh
(74) *Attorney, Agent, or Firm* — Taylor English Duma LLP

(57) ABSTRACT

The present disclosure relates to examples of data hardening. In one example according to aspects of the present disclosure, a method comprises receiving, at a storage device, power loss information in a first format associated with a first protocol. The method further comprises converting, at the storage device, the power loss information in the first format to a second format associated with a second protocol, wherein converting the power loss information in the first format to the second format comprises converting one of a power loss primitive or a power loss command to one of a primitive or command for hardening data.

20 Claims, 14 Drawing Sheets

Related U.S. Application Data 2010, now Pat. No. 8,671,258, which is a continuation-in-part of application No. 12/413,307, filed on Mar. 27, 2009, now Pat. No. 8,090,905, and a continuation-in-part of application No. 12/413,312, filed on Mar. 27, 2009, now Pat. No. 8,230,159, and a continuation-in-part of application No. 12/413,329, filed on Mar. 27, 2009, now abandoned.

(51) Int. Cl.
*G11C 29/02* (2006.01)
*G06F 1/30* (2006.01)

(52) U.S. Cl.
CPC .............. *G11C 5/141* (2013.01); *G11C 29/02* (2013.01); *G06F 1/30* (2013.01); *Y02B 60/1246* (2013.01)

(56) References Cited

U.S. PATENT DOCUMENTS

| | | | |
|---|---|---|---|
| 2008/0082741 A1* | 4/2008 | Biessener | G06F 3/0607 711/112 |
| 2008/0091898 A1 | 4/2008 | Takahashi et al. | |
| 2008/0307155 A1 | 12/2008 | Sinclair | |
| 2009/0077315 A1 | 3/2009 | Ogasawara | |
| 2009/0195928 A1* | 8/2009 | Ogawa | G06F 3/0613 360/135 |
| 2010/0058021 A1* | 3/2010 | Kawamura | G06F 3/0608 711/171 |

OTHER PUBLICATIONS

Stenfort, Ross; International Search Report and Written Opinion for PCT/US2010/028981, filed Mar. 27, 2010, mailed Nov. 19, 2010, 6 pgs.

* cited by examiner

STORAGE SYSTEM DATA HARDENING

REFERENCE TO RELATED APPLICATIONS

Priority benefit claims for this application are made in the accompanying Application Data Sheet, Request, or Transmittal (as appropriate, if any). To the extent permitted by the type of the instant application, this application incorporates by reference for all purposes the following applications, all owned by the owner of the instant application:

U.S. application Ser. No. 14/201,058, filed Mar. 7, 2014, first named inventor Ross John Stenfort, and entitled STORAGE SYSTEM DATA HARDENING, U.S. application Ser. No. 13/260,709, filed Dec. 12, 2011, issued as U.S. Pat. No. 8,671,258 on Mar. 11, 2014, first named inventor Ross John Stenfort, and entitled STORAGE SYSTEM LOGICAL BLOCK ADDRESS DE-ALLOCATION MANAGEMENT, U.S. PCT Application Serial No. PCT/US10/28981, filed Mar. 27, 2010, first named inventor Ross John Stenfort, and entitled STORAGE SYSTEM LOGICAL BLOCK ADDRESS DE-ALLOCATION MANAGEMENT AND DATA HARDENING, U.S. application Ser. No. 12/413,307, filed Mar. 27, 2009, issued as U.S. Pat. No. 8,090,905 on Jan. 3, 2012, first named inventor Ross John Stenfort, and entitled SYSTEM, METHOD, AND COMPUTER PROGRAM PRODUCT FOR CONVERTING LOGICAL BLOCK ADDRESS DE-ALLOCATION INFORMATION IN A FIRST FORMAT TO A SECOND FORMAT, U.S. application Ser. No. 12/413,312, filed Mar. 27, 2009, issued as U.S. Pat. No. 8,230,159 on Jul. 24, 2012, first name inventor Ross John Stenfort, and entitled SYSTEM, METHOD, AND COMPUTER PROGRAM PRODUCT FOR SENDING LOGICAL BLOCK ADDRESS DE-ALLOCATION STATUS INFORMATION, and U.S. application Ser. No. 12/413,329, filed Mar. 27, 2009, now abandoned, first name inventor Ross John Stenfort, and entitled SYSTEM, METHOD, AND COMPUTER PROGRAM PRODUCT FOR HARDENING DATA STORED ON A SOLID STATE DISK.

BACKGROUND

1. Field

Advancements in using storage systems are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior an. All references cited herein (if any), including patents, patent applications, and publications, are hereby incorporated by reference in their entireties, whether specifically incorporated or not, for all purposes.

SYNOPSIS

The invention may be implemented in numerous ways, including as a process, an article of manufacture, an apparatus, a system, a composition of matter, and a computer readable medium such as a computer readable storage medium (e.g. media in an optical and/or magnetic mass storage device such as a disk, or an integrated circuit having non-volatile storage such as flash storage) or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

DETAILED DESCRIPTION

Figure 1:
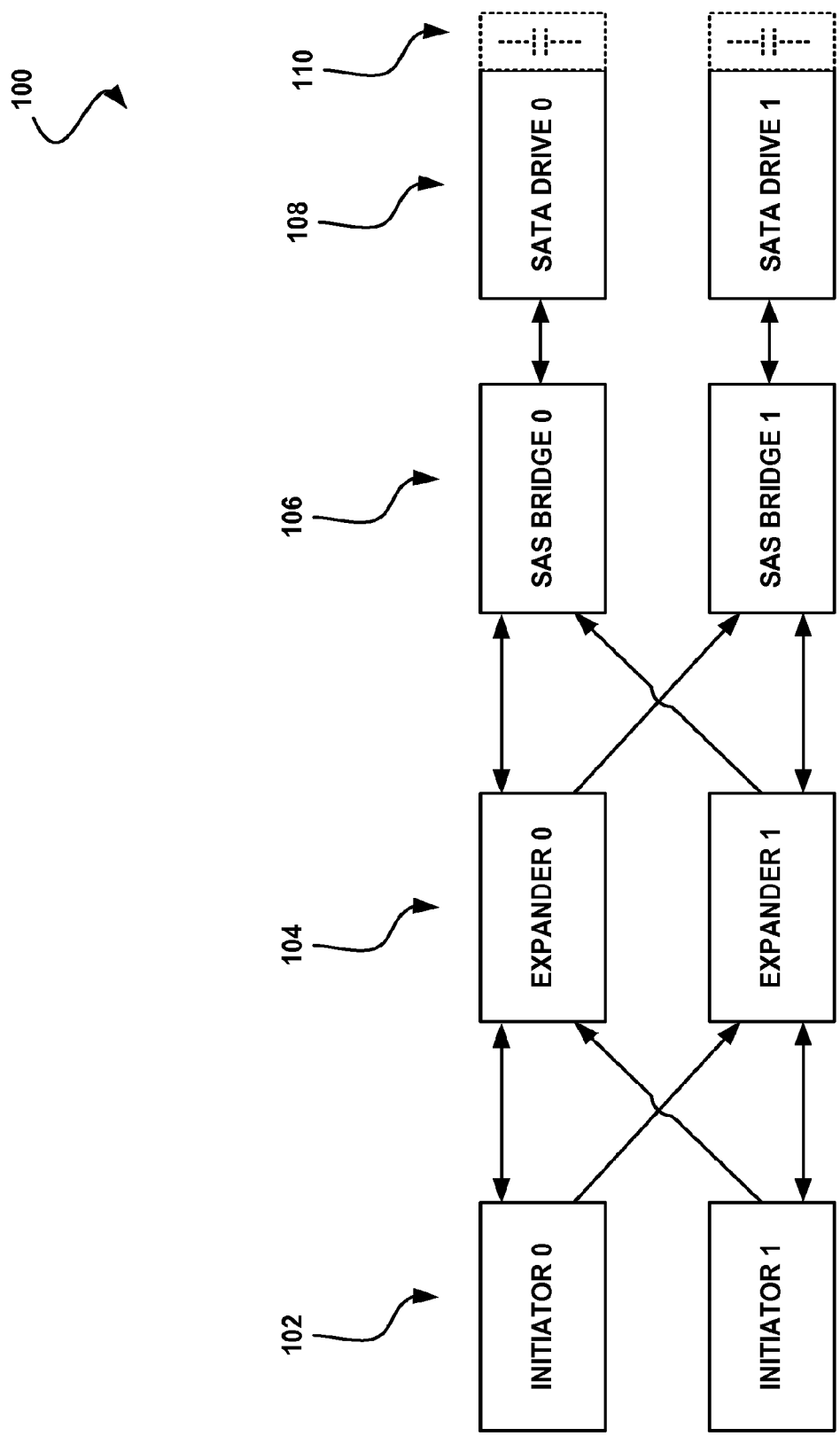
FIG. 1 illustrates selected details of an embodiment of a system providing storage system logical block address de-allocation management and data hardening.

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

Elsewhere herein various shorthand abbreviations, or acronyms, refer to certain elements. The descriptions of at least some of the acronyms follow.

| Acronym | Description |
| --- | --- |
| ASCII | American Standard Code for Information Interchange |
| ATA | Advanced Technology Attachment |
| CD | Compact Disk |
| CF | Compact Flash |
| CMOS | Complementary Metal Oxide Semiconductor |
| CPU | Central Processing Unit |
| DDR | Double-Data-Rate |
| DMA | Direct Memory Access |
| DVD | Digital Versatile/Video Disk |
| ESD | Energy Storage Device |
| ECC | Error-Correcting Code |
| eSATA | external Serial Advanced Technology Attachment |
| HDD | Hard Disk Drive |
| IC | Integrated Circuit |
| IDE | Integrated Drive Electronics |
| LBA | Logical Block Address |
| LPN | Logical Page Number |
| MLC | Multi-Level Cell |
| MMC | MultiMediaCard |
| NCQ | Native Command Queuing |
| ONFI | Open NAND Flash Interface |
| PC | Personal Computer |
| PCIe | Peripheral Component Interconnect express (PCI express) |
| PDA | Personal Digital Assistant |

-continued

| Acronym | Description |
| --- | --- |
| RAID | Redundant Array of Inexpensive/Independent Disks |
| SAS | Serial Attached Small Computer System Interface (Serial SCSI) |
| SAT | SCSI ATA Translation |
| SATA | Serial Advanced Technology Attachment (Serial ATA) |
| SBC-3 | SCSI Block Commands - 3 |
| SCSI | Small Computer System Interface |
| SD | Secure Digital |
| SLC | Single-Level Cell |
| SMART | Self-Monitoring Analysis and Reporting Technology |
| SSD | Solid-State Disk/Drive |
| USB | Universal Serial Bus |
| VPD | Vital Product Data |

Some SSDs store data differently than some HDDs. For example, some HDDs allocate a physical sector of space for every LBA, and a mapping between the (allocated) physical sectors and the LBAs remains fixed. Conceptually the physical locations of the LBAs on the HDD do not move. However, some SSDs do not (pre-)allocate physical space for each LBA. In addition, some SSDs are operated to periodically move stored data from one location to another to avoid data loss. In some cases, this movement of data may result in a loss of performance and additional wear on an SSD. To reduce and/or avoid this problem it is desirable for an operating system to "free up" LBAs on an SSD when the data contained in these LBAs is no longer valid. Further, some SSDs have super capacitors or batteries to provide power to enable flushing all volatile data in the SSD to non-volatile flash memory if power is unexpectedly lost, thus preventing data loss. Some super capacitors and batteries have a relatively large cost and are relatively prone to failure.

Storage system LBA de-allocation management and data hardening provide improvements in performance, efficiency, and utility of use. Optionally, LBA de-allocation information in a first format (e.g. associated with a first protocol) is converted to a second format (e.g. associated with a second protocol). An example of the first protocol is a SCSI protocol, and an example of the second protocol is an ATA protocol. Optionally, LBA de-allocation status information is determined by a storage device, such as an SSD, and communicated to another device such as an initiator, expander, or bridge. Optionally, data stored on an SSD is hardened, such as in response to determining that the SSD is to be powered off. The hardening is via power supplied by an energy storage element, such as a super capacitor or a battery.

Some types of SSDs use flash memory to provide non-volatile storage (e.g., the flash memory retains information without application of power). Some SSDs are compatible with form-factors, electrical interfaces, and/or protocols used by magnetic and/or optical non-volatile storage, such as HDDs, CD drives, and DVD drive. Some SSD are enabled to couple to a computing host via a host interface of an included SSD controller. Some SSD controllers are enabled to couple to flash memory via one or more included flash memory interfaces.

According to various embodiments, the host interface is compatible with one or more of a USB interface standard, a CF interface standard, an MMC interface standard, an SD interface standard, a Memory Stick interface standard, an xD-picture card interface standard, an IDE interface standard, a SATA interface standard, a SCSI interface standard, a SAS interface standard, and a PCIe interface standard.

According to various embodiments, the computing host is all or any portion of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game. In some embodiments, an interfacing host (such as an SAS/SATA bridge or a SCSI expander) operates as a computing host.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims.

EC1) A system, comprising:
   a first I/O interface enabled to receive first storage protocol commands;
   a second I/O interface enabled to output second storage protocol commands;
   a conversion unit enabled to convert at least some of the received first storage protocol commands into the second storage protocol commands; and
   wherein a first storage protocol de-allocation command of the first storage protocol commands is received in a first format by the first interface and is converted and output in a second format as a second storage protocol de-allocation command of the second storage protocol commands.

EC2) The system of EC1, wherein the de-allocation commands are logical block de-allocation commands comprising at least one logical block address.

EC3) The system of EC1, further comprising mass storage responsive to the second storage protocol commands.

EC4) The system of EC3, wherein the de-allocation command requests de-allocation, with respect to at least one logical block address, of a selected one of user data and protection data, and the mass storage conditionally fulfills the request whenever the user data and the protection data can be de-allocated independently.

EC5) The system of EC3, further comprising an initiator of the first storage protocol commands.

EC6) The system of EC5, further comprising an expander.

EC7) The system of EC1, wherein the first I/O interface, the second I/O interface, and the conversion unit are implemented as a unified assembly.

EC8) The system of EC7, wherein the unified assembly is a bridge unit enabled to couple with an initiator unit generating the first storage protocol commands and the bridge unit is further enabled to couple with a mass storage unit responsive to the second storage protocol commands.

EC9) The system of EC8, wherein in response to at least one instance of power-specific information received by the first I/O interface of the bridge unit, the second I/O interface of the bridge unit outputs a power-specific command, and the mass storage unit response to the power-specific command comprises hardening data.

EC10) The system of EC9, wherein the mass storage unit is implemented using flash memory.

EC11) The system of EC9, wherein the mass storage unit is a solid-state drive.

EC12) The system of EC1, wherein the first storage protocol is compatible with a SCSI protocol and the second storage protocol is compatible with an ATA protocol.

EC13) The system of EC2, wherein the first storage protocol de-allocation command is a SCSI UNMAP command and the second storage protocol de-allocation command is an ATA data set management command.

EC14) The system of EC12, wherein the first storage protocol de-allocation command is a command to write a pattern of data.

EC15) The system of EC14, wherein the command to write a pattern of data is a selected one of a WRITE SAME command and a FORMAT command.

EC16) The system of EC14, wherein the pattern of data is in accordance with a predetermined criteria.

EC17) The system of EC1, wherein the first storage protocol is compatible with a SAS protocol and the second storage protocol is compatible with a SATA protocol.

EC18) The system of EC3, wherein the mass storage is implemented using flash memory.

EC19) The system of EC3, wherein the mass storage is a solid-state drive.

EC20) The system of EC3, wherein the first I/O interface, the second I/O interface, the conversion unit, and the mass storage are implemented as a unified assembly.

EC21) The system of EC20, wherein the unified assembly is a drive unit enabled to couple with an initiator unit generating the first storage protocol commands.

EC22) The system of EC21, wherein the mass storage is implemented using flash memory.

EC23) The system of EC1, wherein the conversion unit is implemented at least partially with dedicated logic.

EC24) The system of EC1, wherein the conversion unit comprises at least one dedicated memory buffer.

EC25) The system of EC1, wherein the conversion unit comprises a hardware state machine.

EC26) The system of EC1, wherein the conversion unit comprises a microcoded state machine.

EC27) The system of EC1, wherein the conversion unit comprises a software agent running on an embedded processor.

EC28) A method, comprising:
   receiving first storage protocol commands via a first I/O interface;
   outputting second storage protocol commands via a second I/O interface;
   converting at least some of the received first storage protocol commands into the second storage protocol commands via a conversion unit; and
   wherein a first storage protocol de-allocation command of the first storage protocol commands is received in a first format by the first interface and is converted and output in a second format as a second storage protocol de-allocation command of the second storage protocol commands.

EC29) The method of EC28, wherein the de-allocation commands are logical block de-allocation commands comprising at least one logical block address.

EC30) The method of EC28, further comprising receiving and responding to the second storage protocol commands by mass storage.

EC31) The method of EC30, further comprising generating the first storage protocol commands by an initiator.

EC32) The method of EC31, further comprising receiving the first storage protocol commands by an expander and forwarding the first storage protocol commands to the first I/O interface by the expander.

EC33) The method of EC28, wherein the first I/O interface, the second I/O interface, and the conversion unit are implemented as a unified assembly.

EC34) The method of EC33, wherein the unified assembly is a bridge unit, the method further comprising generating the first storage protocol commands in an initiator unit, and receiving and responding to the second storage protocol commands by a mass storage unit.

EC35) The method of EC28, wherein the first storage protocol is compatible with a SCSI protocol and the second storage protocol is compatible with an ATA protocol.

EC36) The method of EC35, wherein the first storage protocol d-allocation command is a SCSI UNMAP command and the second storage protocol de-allocation command is an ATA data set management command.

EC37) The method of EC35, wherein the first storage protocol de-allocation command is a command to write a pattern of data.

EC38) The method of EC37, wherein the command to write a pattern of data is a selected one of a WRITE SAME command and a FORMAT command.

EC39) The method of EC37, wherein the pattern of data is in accordance with a predetermined criteria.

EC40) The method of EC28, wherein the first storage protocol is compatible with a SAS protocol and the second storage protocol is compatible with a SATA protocol.

EC41) The method of EC30, wherein the mass storage is implemented using flash memory.

EC42) The method of EC30, wherein the mass storage is a solid-state drive.

EC43) The method of EC30, wherein the first I/O interface, the second I/O interface, the conversion unit, and the mass storage are implemented as a unified assembly.

EC44) The method of EC43, wherein the unified assembly is a drive unit and further comprising generating the first storage protocol commands via an initiator unit.

EC45) The method of EC44, wherein the mass storage is implemented using flash memory.

EC46) The method of EC28, wherein the converting is implemented at least partially with dedicated logic.

EC47) The method of EC28, wherein the converting is performed via at least one dedicated memory buffer.

EC4) The method of EC28, wherein the converting comprises executing state transitions defined by a hardware state machine.

EC49) The method of EC28, wherein the converting comprises executing state transitions defined by microcode.

EC50) The method of EC28, wherein the converting comprises running a software agent on an embedded processor.

EC51) A apparatus, comprising:
first I/O interface means for receiving first storage protocol commands;
second I/O interface means for outputting second storage protocol commands; and
conversion means for converting at least some of the received first storage protocol commands into the second storage protocol commands, the converting comprising converting a first storage protocol de-allocation command of the first storage protocol commands and of a first format to a second storage protocol de-allocation command of the second storage protocol commands and of a second format.

EC52) The apparatus of EC51, wherein the de-allocation commands are logical block de-allocation commands comprising at least one logical block address.

EC53) The apparatus of EC51, further comprising mass storage means for receiving and responding to the second storage protocol commands.

EC54) The apparatus of EC53, further comprising an initiator means for generating the first storage protocol commands.

EC55) The apparatus of EC54, further comprising expander means for receiving the first storage protocol commands and forwarding the first storage protocol commands to the first I/O interface means.

EC56) The apparatus of EC51, wherein the first I/O interface means, the second I/O interface means, and the conversion means are implemented as a unified assembly.

EC57) The apparatus of EC56, wherein the unified assembly is a bridge unit, the apparatus further comprising initiator means for generating the first storage protocol commands, and mass storage means for receiving and responding to the second storage protocol commands.

EC58) The apparatus of EC51, wherein the first storage protocol is compatible with a SCSI protocol and the second storage protocol Is compatible with an ATA protocol.

EC59) The apparatus of EC58, wherein the first storage protocol de-allocation command is a SCSI UNMAP command and the second storage protocol de-allocation command is an ATA data set management command.

EC60) The apparatus of EC58, wherein the first storage protocol de-allocation command is a command to write a pattern of data.

EC61) The apparatus of EC60, wherein the command to write a pattern of data is a selected one of a WRITE SAME command and a FORMAT command.

EC62) The apparatus of EC60, wherein the pattern of data is in accordance with a predetermined criteria.

EC63) The apparatus of EC61, wherein the first storage protocol is compatible with a SAS protocol and the second storage protocol is compatible with a SATA protocol.

EC64) The apparatus of EC53, wherein the mass storage is implemented using flash memory.

EC65) The apparatus of EC53, wherein the mass storage is a solid-state drive.

EC66) The apparatus of EC53, wherein the first I/O interface means, the second I/O interface means, the conversion means, and the mass storage means are implemented as a unified assembly.

EC67) The apparatus of EC66, wherein the unified assembly is a drive unit and further comprising an initiator means for generating the first storage protocol commands.

EC68) The apparatus of EC67, wherein the mass storage is implemented using flash memory.

EC69) The apparatus of EC51, wherein the conversion means comprises dedicated logic.

EC70) The apparatus of EC51, wherein the conversion means comprises at least one dedicated memory buffer.

EC71) The apparatus of EC51, wherein the conversion means comprises a hardware state machine.

EC72) The apparatus of EC51, wherein the conversion means comprises a microcoded state machine.

EC73) The apparatus of EC51, wherein the conversion means comprises a software agent running on an embedded processor.

EC74) A method comprising:
receiving logical block address de-allocation information in a first format associated with a first protocol; and
converting the logical block address de-allocation information in the first format to a second format associated with a second protocol.

EC75) The method of EC74, wherein the first protocol includes a Small Computer System Interface (SCSI) protocol and the second protocol includes an AT Attachment (ATA) protocol.

EC76) The method of EC74, wherein the first protocol includes an ATA protocol and the second protocol includes an SCSI protocol.

EC77) The method of EC74, wherein the logical block address de-allocation information includes a de-allocation command.

EC78) The method of EC77, wherein the de-allocation command includes a command to de-allocate at least one of user data and protection information.

EC79) The method of EC74, wherein the logical block address de-allocation information includes a de-allocation status.

EC80) The method of EC74, wherein converting the logical block address de-allocation information in the first format to the second format includes converting an SCSI UNMAP command to an ATA data set management command.

EC81) The method of EC74, further comprising determining whether one of user data or protection data associated with the logical block address de-allocation information can be de-allocated independently.

EC82) The method of EC81, further comprising de-allocating one of the user data or the protection data independently, if it is determined that one of the user data or the protection data associated with the logical block address de-allocation information can be de-allocated independently.

EC83) The method of EC74, further comprising receiving power loss information in the first format associated with the first protocol.

EC84) The method of EC83, further comprising converting the power loss information in the first format to the second format associated with the second protocol.

EC85) The method of EC84, wherein converting the power loss information in the first format to the second format includes converting one of a power loss primitive or a power loss command to one of a primitive or command for hardening data.

EC86) The method of EC84, wherein converting the power loss information in the first format to the second format includes converting an SCSI power loss primitive to an ATA flush cache command.

EC87) The method of EC74, further comprising receiving a command to write a pattern of data in the first format associated with the first protocol.

EC88) The method of EC87, further comprising converting the command to write a pattern of data in the first format to the second format associated with the second protocol.

EC89) The method of EC88, wherein the command to write a pattern of data includes one of a WRITE SAME command or a FORMAT command.

EC90) The method of EC89, wherein at least one of user data or protection data is de-allocated based on the converted command to write a pattern of data.

EC91) The method of EC74, wherein converting the logical block address de-allocation information in the first format to the second format includes converting a SATA logical block address block alignment to an SCSI logical block address block alignment.

EC92) A computer program product embodied on a computer readable medium, comprising:

computer code for receiving logical block address de-allocation information in a first format associated with a first protocol; and computer code for converting the logical block address de-allocation information in the first format to a second format associated with a second protocol.

EC93) An apparatus, comprising:

a bridge for receiving logical block address de-allocation information in a first format associated with a first protocol and for converting the logical block address de-allocation information in the first format to a second format associated with a second protocol.

EC94) A method comprising:

receiving power loss information in a first format associated with a first protocol; and converting the power loss information in the first format to a second format associated with a second protocol;

wherein converting the power loss information in the first format to the second format includes converting one of a power loss primitive or a power loss command to one of a primitive or command for hardening data.

EC95) A computer program product embodied on a computer readable medium, comprising:

computer code for receiving power loss information in a first format associated with a first protocol; and computer code for converting the power loss information in the first format to a second format associated with a second protocol;

wherein converting the power loss information in the first format to the second format includes converting one of a power loss primitive or a power loss command to one of a primitive or command for hardening data.

EC96) An apparatus, comprising:

a bridge for receiving power loss information in a first format associated with a first protocol and for converting the power loss information in the first format to a second format associated with a second protocol;

wherein converting the power loss information in the first format to the second format includes the bridge converting one of a power loss primitive or a power loss command to one of a primitive or command for hardening data.

EC97) A method comprising:

determining a de-allocation status of at least a portion of memory associated with a logical block address;

generating de-allocation status information, based on the determination; and sending the de-allocation status information to a device.

EC98) The method of EC97, wherein the de-allocation status information includes an indicator for indicating whether the at least a portion of the memory associated with the logical block address is de-allocated.

EC99) The method of EC98, wherein the indicator indicates a mapped status when the at least a portion of the memory associated with the logical block address is allocated.

EC100) The method of EC98, wherein the indicator indicates an unmapped status when the at least a portion of the memory associated with the logical block address is de-allocated.

EC101) The method of EC97, further comprising querying the at least a portion of memory associated with the logical block address for the de-allocation status.

EC102) The method of EC101, wherein the determining of the de-allocation status is initiated by the querying.

EC103) The method of EC102, wherein the querying includes sending at least one of a de-allocation status query command and a de-allocation command.

EC104) The method of EC97, further comprising specifying data that is de-allocated from the at least a portion of memory associated with the logical block address.

EC105) The method of EC104, whereon one of a command or a mode page is utilized to specify one of the data that is de-allocated or a format of data to be returned for de-allocated data.

EC106) The method of EC104, wherein the data that is de-allocated includes at least a portion of at least one of user data or protection data.

EC107) The method of EC97, wherein the at least a portion of memory associated with the logical block address includes one of multiple logical block address sectors, one logical block address sector, or a portion of a logical block address sector.

EC108) The method of EC97, wherein sending the de-allocation status information to the device includes sending a bad status if an unmapped memory block is read.

EC109) The method of EC97, further comprising detecting a command to write a pattern of data.

EC110) The method of EC109, wherein the command to write a pattern of data includes one of a WRITE SAME command or a FORMAT command.

EC111) The method of EC109, wherein at least one of user data or protection data is de-allocated based on the command to write a pattern of data.

EC112) The method of EC97, further comprising storing user data separate from protection data in the at least a portion of memory associated with the logical block address.

EC113) The method of EC97, wherein a flash controller sends the de-allocation status information to the device.

EC114) The method of EC97, wherein the device includes at least one of a protocol chip or protocol based buffer.

EC115) A computer program product embodied on a computer readable medium, comprising:
 computer code for determining a de-allocation status of at least a portion of memory associated with a logical block address; and
 computer code for generating de-allocation status information, based on the determination; and
 computer code for sending the de-allocation status information to a device.

EC116) An apparatus, comprising
 a memory controller for determining a de-allocation status of at least a portion of memory associated with a logical block address, generating de-allocation status information based on the determination, and for sending the de-allocation status information to a device.

EC117) A method comprising:
 determining whether a solid state disk is to be powered off; and
 hardening data stored on the solid state disk, if it is determined that the solid state disk is to be powered off.

EC118) The method of EC117, wherein hardening the data stored on the solid state disk includes issuing a command to harden the data.

EC119) The method of EC118, wherein the command to harden the data includes a flush cache command.

EC120) The method of EC118, wherein the command to harden the data includes one or more of
 a SATA Sleep command,
 a SATA Standby command,
 a SATA Standby Immediate command,
 a SATA Flush Cache command,
 a SATA Flash Cache Ext command,
 a SATA Idle command, and
 a SATA Idle Immediate command.

EC121) The method of EC118, wherein the command to harden the data includes a flush cache ext command.

EC122) The method of EC118, wherein the command to harden the data includes a sleep command.

EC123) The method of EC118, wherein the command to harden the data includes a standby command.

EC124) The method of EC118, wherein the command to harden the data includes a standby immediate command.

EC125) The method of EC118, wherein the command to harden the data includes an idle command.

EC126) The method of EC118, wherein the command to harden the data includes an idle immediate command.

EC127) The method of EC118, wherein it is determined that the solid state disk is to be powered off as part of power cycling.

EC128) The method of EC127, wherein the power cycling is a result of an error recovery.

EC129) The method of EC128, wherein a bridge issues the command to harden the data.

EC130) The method of EC129, further comprising performing the power cycling, after the bridge issues the command to harden the data.

EC131) The method of EC117, further comprising sending a command to the solid state disk to test one of a super capacitor or battery associated with the solid state disk.

EC132) The method of EC131, wherein the command to test the one of the super capacitor or battery associated with the solid state disk is sent by an initiator.

EC133) The method of EC132, wherein the command to test the one of the super capacitor or battery associated with the solid state disk is sent by a bridge.

EC134) The method of EC117, further comprising receiving information from the solid state disk.

EC135) The method of EC134, wherein the information includes a status indicating a last time one of a super capacitor or battery associated with the solid state disk was tested.

EC136) The method of EC135, wherein the solid state disk sends the status indicating the last time the one of the super capacitor or battery associated with the solid state disk was tested.

EC137) The method of EC134, wherein the information includes results of a test of one of a super capacitor or battery associated with the solid state disk.

EC138) The method of EC135, wherein the results indicate a success or failure of the test of the super cap.

EC139) A computer program product embodied on a computer readable medium, comprising:
 computer code for determining whether a solid state disk is to be powered off; and
 computer code for hardening data stored on the solid state disk, if it is determined that the solid state disk is to be powered off.

EC140) An apparatus, comprising:
 a device for determining whether a solid state disk is to be powered off and for hardening data stored on the solid state disk, if it is determined that the solid state disk is to be powered off.

EC141) The apparatus of EC140, wherein the device includes a bridge.

System

FIG. 1 illustrates selected details of an embodiment of a system providing storage system logical block address de-allocation management and data hardening. In some embodiments, system 100 converts logical block address de-allocation information in a first format to a second format. In some embodiments, system 100 sends logical block address de-allocation status information. In some embodiments, system 100 hardens data stored on an SSD.

As shown, the system 100 may include one or more initiators 102. The initiators 102 may be coupled to and in communication with one or more expanders 104. In this case, the expanders 104 may represent any suitable switch. Additionally, one or more bridges 106 may be positioned such that information transmitted from the initiators 102 and/or the expanders 104 is received by the one or more bridges 106 before being communicated to one or more memory devices 108.

In various embodiments, the one or more bridges 106 may include one or more Serial Attached SCSI (SAS) bridges. Additionally, in various embodiments, the one or more memory devices 108 may include one or more Serial ATA (SATA) drives. In this case, the system 100 may operate as an SAS system with SAS bridges for converting Serial SCSI Protocol (SSP) information or Serial Management Protocol (SMP) information to SATA and ATA information.

As shown further, the memory devices 108 may include one or more super capacitors 110. It should be noted that, although the memory devices 108 are discussed in the context of including super capacitors 110, the super capacitors 110 may equally represent one or more batteries. It should be noted that, in another embodiment, the super capacitors 110 may not be included with the memory devices 108. For example, in one embodiment, the memory devices 108 may function without the super capacitors 110 or batteries.

It should be noted that the bridges 106 may receive and/or send a variety of information to and from the initiators 102 and the memory devices 108. In operation, one or more of the bridges 106 may receive logical block address de-allocation information, such as a command to de-allocate at least a portion of the one or more memory devices 108. In the context of the present description, de-allocation information refers to any information associated with the de-allocation of memory. For example, in various embodiments, the de-allocation information may include de-allocation commands (i.e. commands to de-allocate one or more portions of memory, etc.), allocation or de-allocation status, and/or any other information associated with de-allocation. This de-allocation command may be in a first format associated with a first protocol, such as an SSP or SMP format.

One or more of the bridges 106 may then convert the do-allocation command in the SSP or SMP format to a second format associated with a second protocol, such as an ATA format associated with the one or more memory devices 108 (e.g. SATA drives). In one embodiment, converting the logical block address de-allocation information in the first formal to the second format may include converting an SCSI UNMAP command to an ATA data set management command (e.g. using a TRIM setting and/or bit, etc.). The memory devices (e.g. drives) 108 may then de-allocate data in response to the converted de-allocation command.

In some embodiments, one or more of the bridges includes a first I/O interface enabled to receive commands in the first protocol, a conversion unit enabled to convert commands from the first protocol to the second protocol, and a second I/O interface unit enabled to output the converted commands in the second protocol. The conversion unit includes, in various embodiments, one or more of: dedicated hardware logic, a dedicated memory buffer, a hardware state machine, a microcoded state machine, and a software agent running on an embedded processor.

It should be noted that the dec-allocation command may include a command to de-allocate user data, protection data/information, and both user and protection data stored in the memory devices 108. Furthermore, the de-allocation command may include a command to de-allocate an LBA array, an LBA sector, and/or a portion of an LBA sector.

In the context of the present description, protection data refers to any data stored in memory that is used to ensure the accuracy and/or validity of user data. In this case, user data refers to any data that is stored in the memory that is not protection data.

It should also be noted that the de-allocation information conversion is not limited to de-allocation commands. For example, in on embodiment, the bridges 106 may convert any SCSI command to an ATA command. These commands may include data queries, power notifications (e.g. power loss primitives such as a NOTIFY primitive, etc.), and various other information.

Additionally, the bridges 106 are not necessarily limited to convening information in one direction. The bridges 106 may also convert information being communicated from the memory devices 108. For example, in one embodiment, a de-allocation status may be sent from the memory devices 108. In this case, the logical block address de-allocation information may include the do-allocation status. In various embodiments, this status may be in response to a query or other command sent to the memory devices 108.

In another embodiment, SATA logical block address block alignment information may be converted to SCSI logical block address block alignment information using the bridges 106. In this case, converting the logical block address de-allocation information in the first format to the second format may include converting a SATA logical block address block alignment to an SCSI logical block address block alignment. The block alignment may be odd or even or have some other alignment.

In one embodiment, one or more of the bridges 106 and/or logic associated therewith may receive logical block address block alignment information in a first format associated with a first protocol. The bridges 106 and/or logic associated therewith may then convert the logical block address block alignment information in the first format to a second format associated with a second protocol. In this case, converting the logical block address block alignment information in the first format to the second format may include converting a SATA logical block address block alignment to an SCSI logical block address block alignment.

In some cases, user data and protection data stored in the memory devices 108 may be de-allocated independently. In one embodiment, it may be determined whether one of user data or protection data associated with the logical block address de-allocation information can be de-allocated independently. As an option, one or more of the bridges 106 may make this determination.

If it is determined that one of the user data or the protection data associated with the logical block address de-allocation information can be de-allocated independently, the user data and/or the protection data may be de-allocated independently. In one embodiment, this determination may be made based on a pattern of the user data or the protection data.

For example, the user data and/or the protection data may illustrate a pattern such that any data other than one full occurrence of the pattern in memory may be de-allocated. In this case, the de-allocating may occur in an LBA array, an LBA sector, and/or a portion of an LBA sector.

In operation, a de-allocation status of at least a portion of the memory devices 108 associated with a logical block address may be determined. In one embodiment, the de-allocation status may be determined by one or more components of one or more of the memory devices 108. For example, the de-allocation status may be determined by a controller of the memory devices 108. In another embodiment, the de-allocation status may be determined by a chip and/or logic associated with the memory devices 108.

Once the de-allocation status is determined, de-allocation status information may be generated. In this case, the de-allocation status information may be generated by any component or logic associated with the memory devices 108. In one embodiment, these components may also send de-allocation status information to one or more devices.

In this case, the device may include a device that queried for the de-allocation status information (e.g. a memory controller, etc.). In one embodiment, the de-allocation status information may include an indicator for indicating whether at least a portion of the memory associated with the logical block address is de-allocated. As an option, the indicator may indicate a mapped status when at least a portion of the memory associated with the logical block address is allocated.

As another option, the indicator may indicate an unmapped status when at least a portion of the memory associated with the logical block address is de-allocated. In another embodiment, sending the de-allocation status information to the device may include sending a bad status if an unmapped memory block is read. For example, if memory or a portion of memory that is de-allocated is attempted to be read, a bad status indication may be utilized to indicate a de-allocation status of that memory portion.

The de-allocation status determination may be initiated in a variety of ways. For example, in one embodiment, there may be a query for the de-allocation status. In this case, the de-allocation status may be initiated by the querying. The query may be in a variety of forms. For example, the query may include sending a de-allocation status query command and/or a de-allocation command.

Once data is de-allocated from at least a portion of memory devices 108, the data that has been de-allocated may be specified utilizing a command, a mode page, or any other technique for logging or specifying the data that has been de-allocated. Additionally, a command or a mode page may be utilized to specify a format of data to be returned for de-allocated data. In this case, the format may include data, flags or a combination of data and flags.

It should be noted that the data that is de-allocated may include user data, protection data, or both user data and protection data. Additionally, the portion of memory associated with the logical block address that is de-allocated or for which de-allocation status SI information is provided may include one of multiple logical block address sectors, one logical block address sector, or a portion of a logical block address sector.

In one embodiment, memory or a portion of memory may be de-allocated based on a pattern of data. For example, if stored data (e.g. user data, protection data, or both user and protection data, etc.) exhibits a pattern, at least repetitive portions of the data may be de-allocated. As an option, this data that is to be de-allocated may be specified by a command, mode page, or other technique.

In one embodiment, a command to write a pattern of data may be detected. For example, the command to write a pattern of data may include one of a WRITE SAME command, a FORMAT command, or any other command capable of causing a pattern to be written. In this case, at least one of user data or protection data may be de-allocated based on the command to write a pattern of data. It should be noted that the user data may be stored separate from protection data in the memory.

In operation, it is determined whether at least one of the memory devices 108 is to be powered off. For example, in one embodiment, one of the initiators 102 may determine that the memory devices 108 are to be powered off. In another embodiment, a memory controller or a protocol chip associated with the memory devices 108 may determine that the memory devices 108 are to be powered off. In yet another embodiment, one or more of the bridges 106 may determine whether at least one of the memory devices 108 is to be powered off. In various embodiments, the determination that the memory devices 108 are to be powered off may be based on the receipt and/or issuance of one or more of a power off/down command, a sleep command, and a standby immediate command (such as at or by the bridges 106).

In still another embodiment, power loss information may be received (e.g. by the bridges 106, a controller of the memory device, etc.) in the first format associated with the first protocol. In this case, the power loss information in the first format may be converted to the second format associated with the second protocol. For example, the power loss information may include an SCSI power loss primitive (e.g. a NOTIFY primitive, etc.). Thus, converting the power loss information in the first format to the second format may include converting the SCSI power loss primitive into an ATA flush cache command. In one embodiment, the converting may also include converting the power loss primitive to a sleep command or a standby immediate command.

Additionally, converting the power loss information in the first format to the second format may include converting a power loss primitive or a power loss command to a primitive or command for hardening data. In the context of the present description, hardening data refers to any technique of writing data in volatile memory (e.g. a cache) to non-volatile memory (e.g. as flash memory) or alternatively writing data in cache to memory such as flash memory. Accordingly, a power loss primitive or command may be received by the bridges 106 and may be converted to any command or primitive for hardening the stored data.

If it is determined that the memory devices 108 are to be powered off any data stored on the memory devices 108 may be hardened. It should be noted that any or all data stored on the memory devices 108 may be hardened. For example, the data that is hardened my include user data, protection data, or both user data and protection data.

In various embodiments, the memory devices 108 may send information to any one or more of any of the bridges 106 or any of the initiators 102. For example, the information may include a status indicating a last time the super capacitor 110 was tested. Additionally, the information may include results of a test of the super capacitor 110. In this case, the results may indicate a success or failure of the test of the super capacitor 110.

The bridges 106 are not necessarily limited to receiving information. In one embodiment, the bridges 106 may also convert information being communicated from the memory devices 108. For example, in one embodiment, a de-allocation status may be sent from the memory devices 108. In various embodiments, this status may be in response to a query or another command sent to the memory devices 108.

Figure 2:
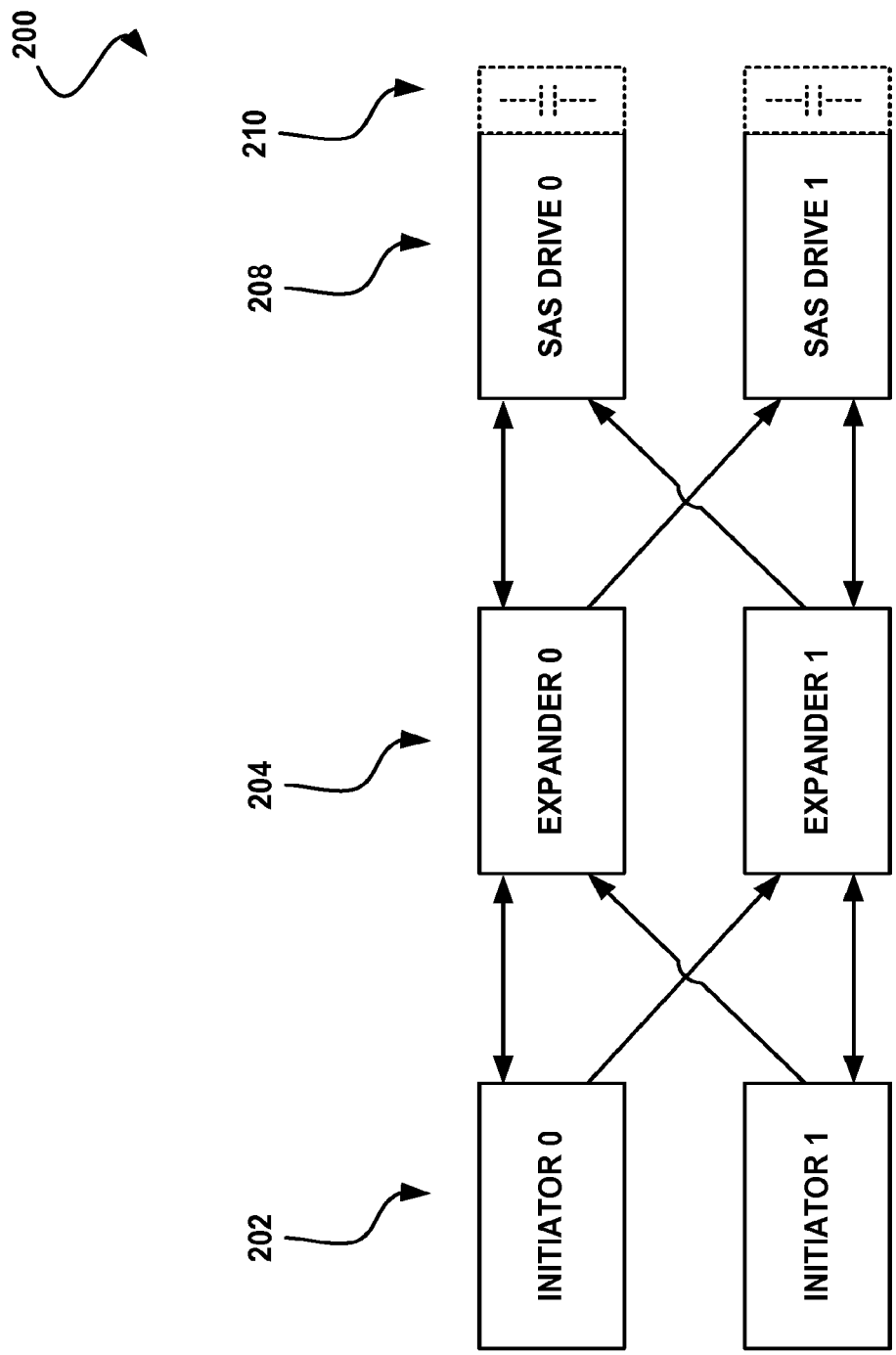
FIG. 2 illustrates selected details of another embodiment of a system providing storage system logical block address de-allocation management and data hardening.

FIG. 2 illustrates selected details of another embodiment of a system providing storage system logical block address de-allocation management and data hardening. System 200 is similar to system 100 (of FIG. 1), but conceptually an individual SAS drive is used instead of each combination of a SAS bridge and a SATA drive. More specifically, as shown, the system may include one or more initiators 202. The initiators 202 may be coupled to and in communication with one or more expanders 204. Additionally, the initiators 202 and the expanders 204 may be coupled to and in communication with one or more memory devices 208.

In various embodiments, the one or more memory devices 208 may include one or more Serial Attached SCSI (SAS) drives. In this case, the system 200 may operate as a Serial Attached SCSI (SAS) system with SAS drives. In various other embodiments, the one or more memory devices 208 may include any type of solid state disk.

As shown further, the one or more memory devices 208 may include one or more super capacitors 210. It should be noted that, although the memory devices 208 are discussed in the context of including super capacitors 210, the super capacitors 210 may equally represent one or more batteries. It should also be noted that, in another embodiment, the super capacitors 210 may not be included with the memory devices 208. For example, in one embodiment, the memory devices 208 may function without the super capacitors 210 or batteries.

In structure and operation, system 200 is similar to system 100 (of FIG. 1). More specifically, the initiators, the expanders, and the super capacitors of FIG. 2 are similar to respective elements of FIG. 1, and the one or more memory devices 208 (of FIG. 2) are similar to the combination of the one or more bridges 106 coupled to the one or more memory devices 108 (of FIG. 1). Therefore, the preceding descriptions of such elements and their operation associated with FIG. 1 are equally applicable to FIG. 2, with the understanding that functions associated with the bridges of FIG. 1 are instead associated with the memory devices 206 (such as SAS drives) of FIG. 2 (in addition to the functions associated with the expanders of FIG. 1 being associated with the expanders of FIG. 2).

Other embodiments include a variation of FIG. 1 where the initiators are coupled more directly to the SAS bridges, such as without intervening expanders. Related embodiments include a variation of FIG. 2 where the initiators are coupled more directly to the one or more memories (e.g. SAS drives), such as without intervening expanders. Other embodiments include a variation of FIG. 1 where the initiators are coupled more directly to the one or more memory devices (e.g. SATA drives), such as without intervening expanders and SAS bridges. Other embodiments include variations of FIG. 1 where one or more of the SAS bridges are each coupled to a plurality of the memory devices (such as two SAS bridges each being coupled to a respective pair of SATA drives). The preceding descriptions of FIG. 1 and FIG. 2 are applicable to the aforementioned variations.

Operation

Figure 3A:
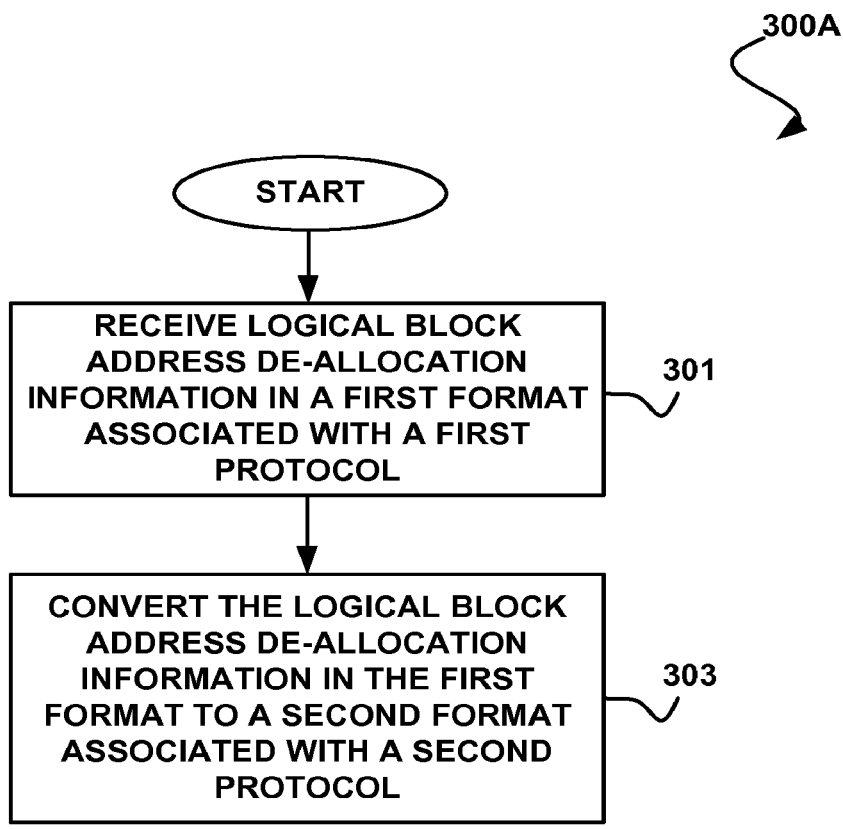
FIG. 3A illustrates selected details of an embodiment for converting Logical Block Address (LBA) de-allocation information in a first format to a second format.

FIG. 3A illustrates selected details of an embodiment 300A for converting Logical Block Address (LBA) de-allocation information in a first format to a second format. As shown, logical block address de-allocation information is received in a first format associated with a first protocol. See operation 301.

In the context of the present description, a logical block address refers to any item capable of indicating a location of blocks of data stored on a memory device. For example, in one embodiment, the logical block address may include an address of a block of data in memory. In another embodiment, the logical block address may include an address of a portion of memory (e.g. an LBA sector, a portion of an LBA sector, etc.).

The memory may include any type of memory. For example, the memory may include one or more solid state disk (SSDs). In this case, the SSD may include RAM (e.g. SRAM, DRAM, etc.).

In another embodiment, the SSD may include flash memory. In this case, the flash memory may include non-volatile flash memory, in various embodiments, the flash memory may include single-level cell (SLC) flash memory and/or multi-level cell (MLC) flash memory.

Further, in the context of the present description, de-allocation information refers to any information associated with the de-allocation of memory. For example, in various embodiments, the de-allocation information may include de-allocation commands (i.e. commands to de-allocate one or more portions of memory, etc.), allocation or de-allocation status, and/or any other information associated with de-allocation. In this case, de-allocation refers to any technique capable of freeing up logical block addresses, or portions thereof, in memory.

In addition to receiving the logical block address de-allocation information, the logical block address de-allocation information in the first format is converted to a second format associated with a second protocol. See operation 303. The first and second protocol may include any protocol or set of standards for physically connecting and/or transferring data between devices (e.g. computing devices, peripherals, etc.).

In one embodiment, the first and the second protocol may include one of a Small Computer System Interface (SCSI) protocol and an AT Attachment (ATA) protocol. For example, the first protocol may include an SCSI protocol and the second protocol may include an ATA protocol. As another example, the first protocol may include an ATA protocol and the second protocol may include an SCSI protocol.

In these cases, the formats associated with the protocols may include any standard format of the protocol. For example, the format associated with the SCSI protocol may include a standard SCSI format for de-allocation commands, tasks or primitives containing power or de-allocation information, and any other technique of communicating information. Similarly, the format associated with the ATA protocol may include a standard ATA format for de-allocation commands, power commands, primitives, and any other information.

Accordingly, in one embodiment, the logical block address de-allocation information in an SCSI format may be converted to an ATA format associated with the ATA protocol. In another embodiment, the logical block address de-allocation information in the ATA format may be converted to the SCSI format associated with the SCSI protocol. Of course, these formats are only examples, as de-allocation information in any format associated with a protocol may be converted to any other format associated with another protocol.

Figure 3B:
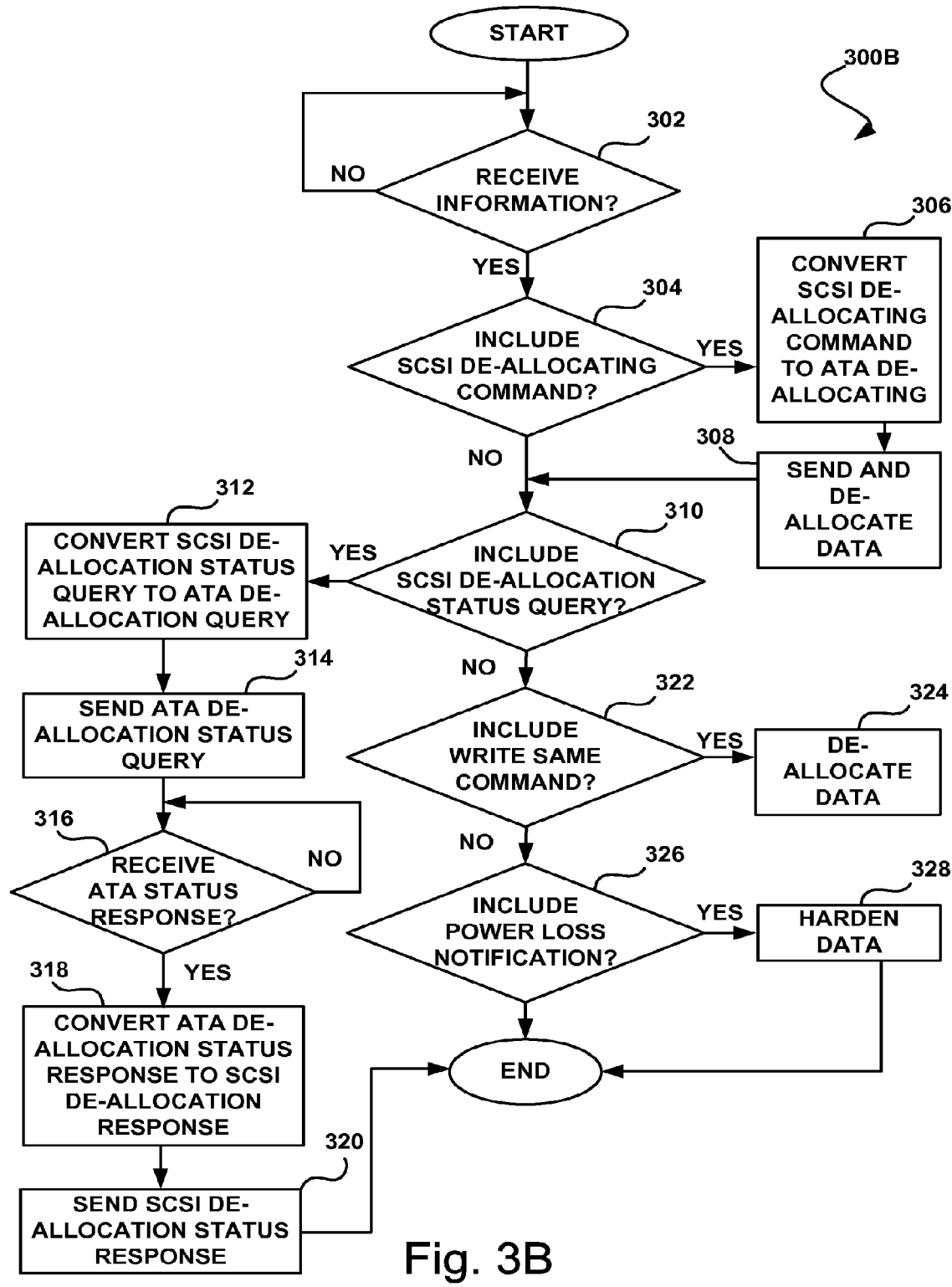
FIG. 3B illustrates selected details of an embodiment for converting LBA de-allocation information in a Small Computer System Interface (SCSI) format to an Advanced Technology Attachment (ATA) format.

FIG. 3B illustrates selected details of an embodiment 300B for converting LBA de-allocation information in a SCSI format to an ATA format.

As shown, t is determined if information is received at a bridge (e.g. an SAS bridge, etc.). See operation 302. In one embodiment, this determination may be made at the bridge. In this case, the bridge may include logic and/or hardware for making such determination, as well as for making any other decisions and/or performing other functions.

If information is received at the bridge, it is determined whether the information includes an SCSI de-allocating command. See operation 304. If the information includes an SCSI de-allocating command, the SCSI de-allocating command is converted to an ATA de-allocating command. See operation 306.

In one embodiment, this conversion may include converting an SCSI UNMAP command to an ATA DATA SET MANAGEMENT command. Once the SCSI de-allocating command is converted to an ATA de-allocating command, the command is sent and the data is de-allocated. See operation 308. The de-allocation may include de-allocating user data, protection data, or both.

In the context of the present description, protection data refers to any data stored in memory that is utilized to ensure the accuracy and/or validity of user data. In this case, user data refers to any data that is stored in the memory that is not protect ion data.

As shown further in the figure, it is determined whether the information includes an SCSI de-allocation status query. See operation 310. It should be noted that, in one embodiment, a de-allocation query need not be sent to receive de-allocation status information. For example, a memory device may automatically send de-allocation status information (e.g. upon de-allocation, at a timed interval, etc.).

If the information includes an SCSI de-allocation status query, the SCSI de-allocation status query is converted to an ATA de-allocation status query. See operation 312. Once the SCSI de-allocation status query is converted to an ATA de-allocation status query, the de-allocation status query is sent to a memory device (e.g. a SATA drive, etc.). See operation 314.

It is then determined whether an ATA status response is received. See operation 316. In this case, an ATA status response refers to any response indicating de-allocation status that is in an ATA format. This status may include user data de-allocation status and/or protection data de-allocation status.

If an ATA status response is received, the ATA status response is converted to a format associated with the SCSI protocol. See operation 318. The de-allocation status response may then be sent to a device that initiated the query (e.g. a memory controller, etc.). See operation 320.

In addition to determining whether the information received by the bridge includes de-allocation status information, it is also determined whether the received information includes a WRITE SAME command, or other pattern initiating command (e.g. a FORMAT command, etc.). Sec operation 322. If the received information includes a WRITE SAME command, or other pattern initiating command, data stored in the memory device may be de-allocated based on that command. See operation 324.

In this case, a WRITE SAME command, a FORMAT command, and other commands that include writing patterns may be used to determine that the memory location storing or directed to store duplicate data (e.g. any pattern of data following the initial data, etc.) may be de-allocated. This data may include user data and/or protection data. Furthermore, it should be noted that, while in one embodiment the bridge may be utilized to make this detection, in other embodiments, different devices may be utilized to make this detection (e.g. a memory controller, a protocol chip, etc.). Thus, such technique may be implemented in systems without bridges.

In this way, it may be determined automatically in ATA and SCSI, using WRITE SAME or other similar write commands, if user data and or protection data may be de-allocated independently. For example, a command may be received to write a pattern of data in a first format associated with a first protocol (e.g. a WRITE SAME command, a FORMAT command, etc.). The command to write a pattern of data in the first format may then be converted to a second format associated with a second protocol. User data and/or protection data may be de-allocated based on the converted command to write a pattern.

It may also be determined if the information received by the bridge includes a power loss notification. See operation 326. If a power loss notification is detected, the data stored in memory may be hardened. See operation 328.

For example, if the bridge receives a NOTIFY (POWER LOSS) primitive, the bridge may pass this information to an SSD so it can harden data. In various embodiments, this may be translated by bringing the communication link down, through an out-of-band (OOB) command or by sending another command. In one embodiment, a FLUSH CACHE ATA command may be sent as a result of the bridge receiving a NOTIFY (POWER LOSS) primitive. In another embodiment, the power loss primitive may be converted to a sleep command or a standby immediate command.

In this way, de-allocation information that is communicated from an initiator to a bridge, and from the bridge to an SSD may be used to de-allocate LBAs. In one embodiment, the bridge may be configured to support maximum UNMAP LBA count, and maximum block descriptor count. These may be based on firmware associated with the bridge.

It should be noted that both the ATA protocol and the SCSI protocol have a command that will de-allocate memory blocks. For example, the ATA protocol utilizes the Data Set Management Command to de-allocate blocks. The format of this command is illustrated in Table 1.

TABLE 1

Data Set Management Command

| Relevant Fields | Description |
|---|---|
| Feature | If bit 0 is set to "1" this is a "TRIM" function |
| Count | This is the number of 512 byte Data Structures to be transferred from the host to device. A value of "0" is 65,536 blocks. |
| Command | 06h |

The host will then send data to the device as "Pin Data." The format of this data is shown in Table 2.

TABLE 2

Pin Data Format

| Byte | Entry Number |
|---|---|
| 0-7 | Entry 0 |
| 8-15 | Entry 1 |
| ... | |
| 496-511 | Entry 64 |

The count field may determine how many 512 byte data structure, will be ent. The format of the pin data entry is shown in Table 3.

TABLE 3

Pin Data Entry 0

63:48 Range Length
47:0 LBA Value

It should be noted that a value of "0" for the range makes the entry invalid. Additionally, the data may be sorted in ascending LBA order and may not be overlapping.

Furthermore, there is information in the identify data that allows the host to determine information about the device. This data is shown in Table 4. It should be noted the command for changing support is Device Configuration Identify command.

TABLE 4

Identify Data

| Word | Bits | Description |
|---|---|---|
| 21 | 10 | Reporting support for the Data Set Management is changeable. |
| 69 | 14 | Deterministic Read After TRIM is supported. A value of "1" means the read data will be deterministic. |
| 169 | 0 | Trim bit in DATA SET MANAGEMENT is supported |

The SCSI protocol also allows the de-allocation of blocks (e.g. LBA). For example, there are a number of commands and related fields in SBC-3 capable of affecting thin provisioning (e.g. allowing resources, such as storage space, to be flexibly allocated to servers, on a just-enough and a just-in-time basis). In the BLOCK LIMITS VPD PAGE there are some relevant fields. For example, the Maximum UNMAP LBA Count field is the maximum number of LBAs that may be unmapped in a single command. If the maximum number of LBAs that can be unmapped are constrained only by the amount of data contained in the UNMAP parameter list then this field may be set to FFFF_FFFFh. A value of 0 indicates this field is not supported.

The Maximum UNMAP Block Descriptor Count is the maximum number of UNMAP block descriptors that may be contained in the parameter data for the UNMAP command. If there is no limit, this field may be set to FFFF_FFFFh. If this field is not supported then the field may be set to 0.

The FORMAT UNIT is also relevant. When formatting a thin provisioned device if protection is enabled then the protection field should be 64'hFFFF_FFFF_FFFF_FFFF. If protection is not enabled, then the device may be formatted to the Initialization Pattern based on the Initialization pattern descriptor. It should be noted that the initialization pattern type field may be set to "00" (e.g. a device use default pattern, etc.) and the initialization pattern length may be set to "0." Other values of "initialization pattern type" will produce patterns based on the data sent to the device. Thus, the device may be instructed to format with pattern "X, Y, Z," protection bytes of all FF's, UNMAP all LBAs, or have none of the LBAs unmapped due to how data is stored.

The Read Capacity Command also has a number of relevant parameter fields for thin provisioning. The fields are shown in Table 5.

TABLE 5

Read Capacity Fields

| Field | Description |
|---|---|
| TPE | If set to "1" this indicates this is a thin provisioned device. |
| LOWEST ALIGNED LOGICAL BLOCK ADDRESS | This field points to the lowest LBA aligned block. |
| LOGICAL BLOCKS PER PHYSICAL BLOCK EXPONENT | This field will describe the number of physical blocks per logical block. |
| TPRZ | In a thin provisioned device if this is set to "1" the device will return "0"s for the user data. If this bit is set to "0" the device shall return user data with any random value. The protection data is NOT specified by this bit. |

Table 6 shows Protection Decode Fields. In this case, if protection is enabled and the P_I_EXPONENT field is non-zero then there is more than one protection field for each LBA.

TABLE 6

Protection Decode Fields

| Field | Description |
|---|---|
| PROT_EN and P_TYPE | This describes the protection mode (0-3). |
| P_I_EXPONENT | This determines the protection information interval placed within each logical block. |

In some cases, a Verify command may have special handling when issued to an unmapped block. If BYTECHK is "0" then the device may assume the LBA has been verified for an unmapped block. If BYTECHK is "1" then the device shall terminate the command with a check condition.

The UNMAP command may be used to de-allocate LBAs from a thin provisioned device. Once an UNMAP function has been performed, the data from the unmapped LBA may not be read by any other LBA. Additionally, the data from the unmapped LBA may or may not be indeterminate. Further, the data from the unmapped LBA after the UNMAP operation should not change (e.g. multiple reads of an unmapped LBA shall always return the same data). Still yet, if protection is enabled then the protection data may not be set to 64'hFFFF_FFFF_FFFF_FFFF when the data is unmapped.

Relevant fields in the UNMAP command are shown in Table 7.

TABLE 7

Relevant UNMAP Command Fields

| Field | Description |
|---|---|
| Op Code | This is the command code. This is (42h). |
| Parameter List Length | This is the length of the parameter list in bytes to be sent to the device. |

The parameter list may cause structures to be built to pass a list of UNMAP block descriptors. The relevant fields in the descriptor are shown in Table 8.

TABLE 8

UNMAP Descriptor Fields

| Field | Description |
|---|---|
| UNMAP LBA | This is the starting LBA to UNMAP. |
| Number of Logical Blocks | This is the number of LBAs to UNMAP. |

It should be noted that when multiple descriptors are passed, the LBAs may be in any order and may overlap. If the LBA plus the number of blocks exceed the capacity of the device, a check condition may be returned. Additionally, if the number of logical blocks is 0, this is typically not an error condition. If the number of logical blocks in the UNMAP block descriptor exceed the VPD allowed setting, or the number of UNMAP block descriptors exceed the VPD setting, then a check condition may be returned.

The WRITE SAME command can be used to write the same data to many LBAs. Depending on the LBDATA and PBDATA bits, however, the information may not be identical. If the UNMAP bit is set, the blocks should be UNMAPPED and not written to if possible. When UNMAPPING, the user data may be 0 and the protection data may be 64'hFFFF_FFFF_FFFF_FFFF. If this condition is not satisfied by the WRITE SAME settings, then the write may take place even when the UNMAP bit is set.

It should be noted that it is expected that a WRITE SAME command issued with and without the UNMAP bit set is expected to have the exact same result if the data is read back. The permutations of possible data patterns are in Table 9.

In some embodiments, converting a SCSI UNMAP command to an ATA DATA SET MANAGEMENT command operates at least in part as follows. An UNMAP command has some number of UNMAP block descriptors containing an 8-byte LBA, and a 4-byte number of logical blocks specifying how many blocks to free up starting at the LBA. The descriptors are not in any particular order (e.g. descriptors having lower-numbered LBAs may follow descriptors having higher-numbered LBAs, and vice-versa). Further, the logical blocks specified by the descriptors may overlap. The descriptors may specify de-allocation in any order.

A Data Set Management Command/TRIM operation is specified by having bit 0 of the feature register (sometimes referred to as the TRIM bit) set to one. The data provided by the command is a list of descriptors each having a 6-byte LBA value and a 2-byte length. The list is sorted in ascending order according to LBA values.

Converting from UNMAP to TRIM includes extracting LBA and number of logical blocks information from each of the descriptors. If any LBA has any non-zero bits in either of the two most-significant bytes, then there is an error. If any of the numbers of logical blocks have any non-zero bits in either of the two most-significant bytes, then the descriptor is processed as a collection of descriptors each with no non-zero bits in either of the two most-significant bytes in the number of logical blocks values, and with the collection covering the same LBAs as the original descriptor. The resultant LBAs from all of die descriptors are sorted in ascending order, and supplied (truncated to the least-significant six bytes) in the sorted order as descriptors to the TRIM command (along with the corresponding number of logical blocks values as lengths truncated to the least-significant two bytes).

TABLE 9

LBDATA/PBDATA Fields

| LBDATA | PBDATA | Description |
|---|---|---|
| 0 | 0 | If the media is formatted with type 1 or 2 protection then:<br>1. The Logical Block Reference Tag shall be placed in the first block and this shall be incremented for each block following this one.<br>If the media is formatted with type 1, 2, or 3 protection then:<br>1. If the ATO bit is set to "1" in the Control Mode Page then the application tag shall be placed into every frame.<br>2. The Logical Block Guard Field shall be placed into each block. |
| 0 | 1 | If the media is formatted with protection 1, 2 or 3 then the data shall be formatted with protection values of 64'hFFFF_FFFF_FFFF_FFFF.<br>If the media is not formatted with protection then the first 8 bytes of the block shall be formatted with the physical sector address. |
| 1 | 0 | If the media is formatted with protection 1, 2, or 3 then the data shall be formatted with protection values of 64'hFFFF_FFFF_FFFF_FFFF.<br>If the media is not formatted with protection then the first 4 bytes of the block shall be formatted with an unusual concatenation of the LBA - see SBC-3 Table 94 for details. |
| 1 | 1 | This is an illegal condition that should be Check Conditioned. |

If a write is unable to complete due to no more resources, a check condition may be returned informing the initiator the write failed but resources are being freed and that the write should be tried again. If it is not expected to have space for this command, status may be returned to the initiator of this condition.

It should be noted that, currently, FORMAT translation is described in SAT. There are, however, optimizations that may improve the life of the drive. If the LBAs are going to be written with all 0's in the user field and no protection, or all 0's in the user field and 64'hFFFF_FFFF_FFFF_FFFF in the protection field, the DATA SET MANAGEMENT/ TRIM command may be used. This may be based on the IP bit in the FORMAT command.

Converting from a SCSI UNMAP to a SATA IO SEND FPDMA Command with TRIM bit set is similar, as only underlying transport is different, and therefore the same descriptor conversions are performed.

It should be noted the ATA protocol and the SCSI protocol commands and associated descriptions provided herein are examples of commands and fields that may be converted to or from different formats using the techniques and functionality described above. In other embodiments, any command or information in a first protocol format may be converted to a second protocol format.

Figure 4A:
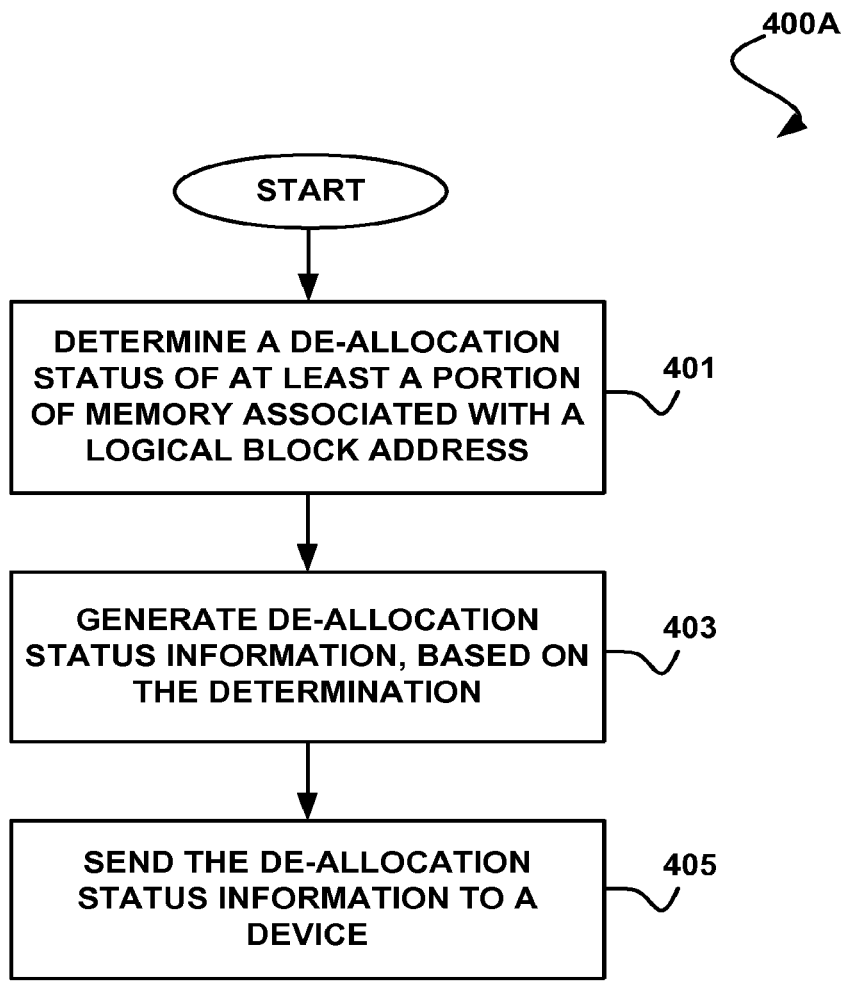
FIG. 4A illustrates selected details of an embodiment for sending LBA de-allocation status information.

FIG. 4A illustrates selected details of an embodiment 400A for sending LBA de-allocation status information. As shown, a de-allocation status of at least a portion of memory associated with a logical block address is determined. See operation 401.

The memory may include any type of memory. For example, the memory may include a solid state disk (SSD). In this case, the SSD may include RAM (e.g. SRAM, DRAM, etc.).

In another embodiment, the SSD may include flush memory. In this case, the flash memory may include non-volatile flash memory. In various embodiments, the flash memory may include single-level cell (SLC) flash memory and/or multi-level cell (MLC) flash memory.

Furthermore, in the context of the present description, de-allocation status information refers to any information associated with the de-allocation status of memory. For example, in various embodiments, the de-allocation status information may include an indicator for indicating whether a portion of the memory associated with the logical block address is allocated or de-allocated, an indicator for indicating whether the entire memory associated with the logical block address is allocated or de-allocated, and/or any other information associated with de-allocation status. In this case, de-allocation refers to any technique capable of freeing up logical block addresses, or a portion thereof, in memory.

Once a de-allocation status of at least a portion of memory associated with a logical block address is determined, de-allocation status information is generated based on the determination. See operation 403. Thus, based on the determined status of the memory, the de-allocation status information is generated.

The de-allocation status information is then sent to a device. See operation 405. The device may include any device capable of receiving de-allocation status information. For example, the device may include at least one of a protocol chip, a protocol based buffer, a bridge, a memory controller, and/or any other device capable of receiving de-allocation status information. In one embodiment, the protocol chip and/or the protocol based buffer may be associated with one of a Small Computer System Interface (SCSI) protocol and an AT Attachment (ATA) protocol.

Similarly, the de-allocation status may be determined and the de-allocation status may be generated using a variety of devices. For example, in one embodiment, the de-allocation status information may be generated and/or sent by a memory controller (e.g. a flash controller, etc.). In another embodiment, a bridge may generate and send the de-allocation status information to the device. In yet another embodiment, a protocol chip may generate and send the de-allocation status information to the device.

Figure 4B:
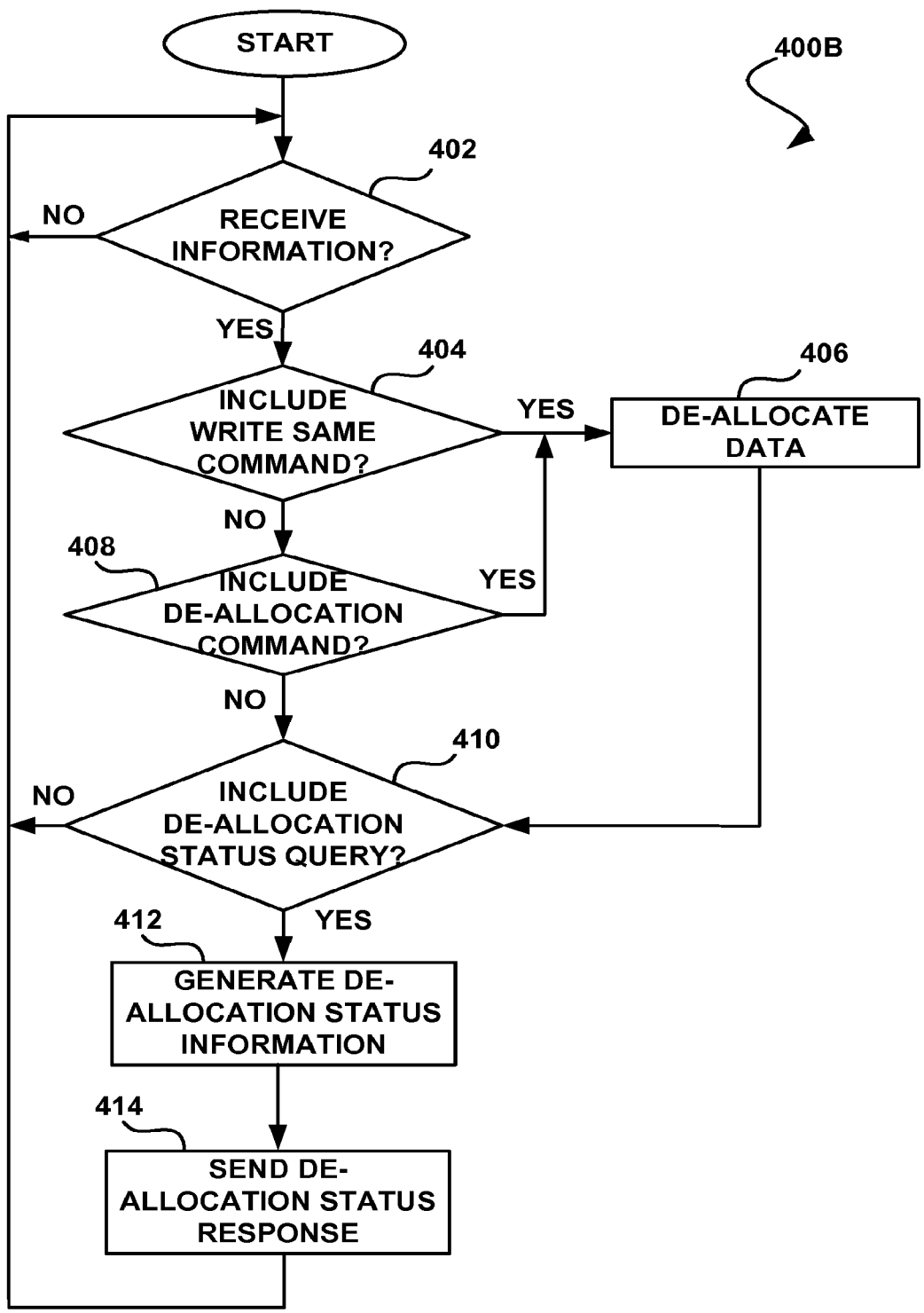
FIG. 4B illustrates selected details of another embodiment for sending LBA de-allocation status information.

FIG. 4B illustrates selected details of another embodiment 400B for sending LBA de-allocation status information. As shown, it is determined if information is received. See option 402. In one embodiment, this determination may be made at one or more flash controllers, or other controller of a memory device. In this case, the flash controllers may include logic and/or hardware for making such determination, as well as for making any other decisions and/or performing additional functions.

If information is received, it is determined whether the received information includes a WRITE SAME command, or other pattern initiating command (e.g. a FOR MAT command, etc.). See operation 404. If the received information includes a WRITE SAME command, or other pattern initiating command, data stored in the memory device may be de-allocated based on that command. See operation 406.

In this case, a WRITE SAME command, a FORMAT command, and other commands that include writing patterns may be used to determine that the memory location storing or directed to store duplicate data (e.g. any pattern of data following the initial data, etc.) may be de-allocated. This data may include user data and/or protection data. Furthermore, it should be noted that, while in one embodiment a flash controller may be utilized to make this detection, in other embodiments, different devices may be utilized to make this detection (e.g. a bridge, a protocol chip, etc.). Thus, such technique may be implemented in systems implementing bridges.

In addition to determining whether the received information includes a WRITE SAME command, or other pattern initiating command, it is determined whether the information includes a do-allocation command. See operation 408. If the information includes a de-allocation command (e.g. an SCSI de-allocation command, an ATA de-allocation command, etc.), data stored in the memory device may be de-allocated based on that command. In one embodiment, this may include converting an SCSI UNMAP command to an ATA DATA SET MANAGEMENT command. The de-allocation may include de-allocating user data, protection data, or both.

As shown further in the figure, it is determined whether the received information includes a de-allocation status query. See operation 410. It should be noted that, in one embodiment, a de-allocation query need not be sent to receive de-allocation status information. For example, a memory device may automatically send deallocation status information (e.g. upon de-allocation, at a timed interval, etc.).

If the information includes a de-allocation status query, de-allocation status information is generated. See operation 412. The de-allocation status information may then be sent to a device capable of receiving the deallocation status information. See operation 414.

Figure 5A:
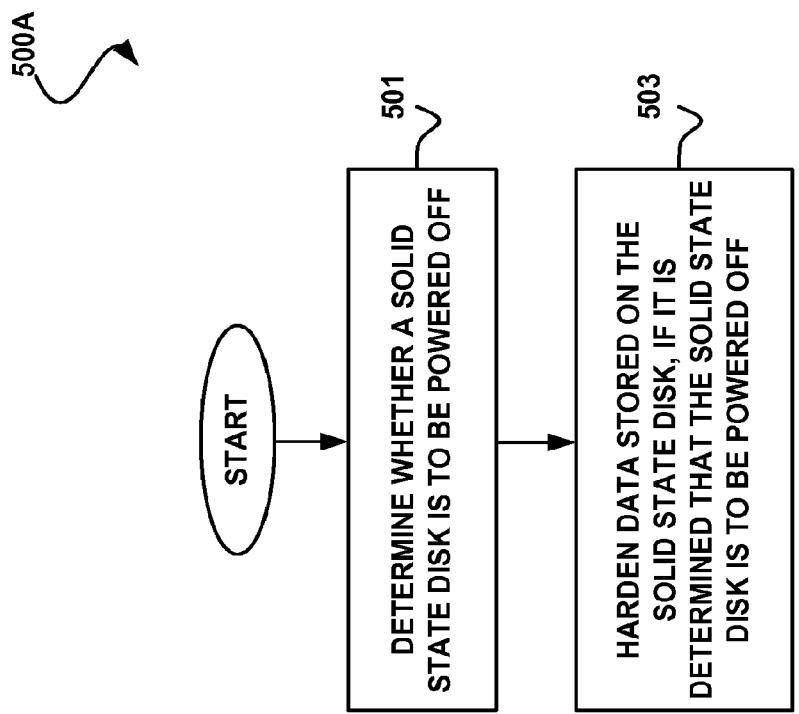
FIG. 5A illustrates selected details of an embodiment for hardening data stored on a Solid State Disk (SSD).

FIG. 5A illustrates selected details of an embodiment 500A for hardening data stored on an SSD. In operation, it is determined whether a solid state disk is to be powered off. See operation 501. It may be determined that the solid state disk is to be powered off based on different criteria.

For example, in one embodiment, it may be determined that the solid state disk is to be powered off based on receiving a power off command. In another embodiment, it may be determined that the solid state disk is to be powered off based on receiving a cycle power command. In yet another embodiment, it may be determined that the solid state disk is to be powered off based on receiving an error signal.

If it is determined that the solid state disk is to be powered off, data stored on the solid state disk is hardened. See operation 503. In the context of the present description, hardening data refers to any technique of writing data in cache or volatile memory to non-volatile memory such as flash memory.

In one embodiment, hardening the data stored on the solid state disk may include issuing a command to harden the data. In this case, the command to harden the data may be issued to the solid state disk or a memory controller associated therewith. The command to harden the data may include any command to harden the data.

For example, in one embodiment, the command to harden the data may include a flush cache command. In another embodiment, the command to harden the data may include a sleep command. In still another embodiment, the command to harden the data may include a standby immediate command.

In one embodiment, it may be determined that the solid state disk is to be powered off as part of power cycling. In this case, the power cycling may be a result of an error recovery. Thus, a device (e.g. a bridge, a memory controller, etc.) may issue the command to harden the data. In one embodiment, after the device issues the command to harden the data, the data may be hardened and the solid state disk may be power cycled.

Figure 5B:
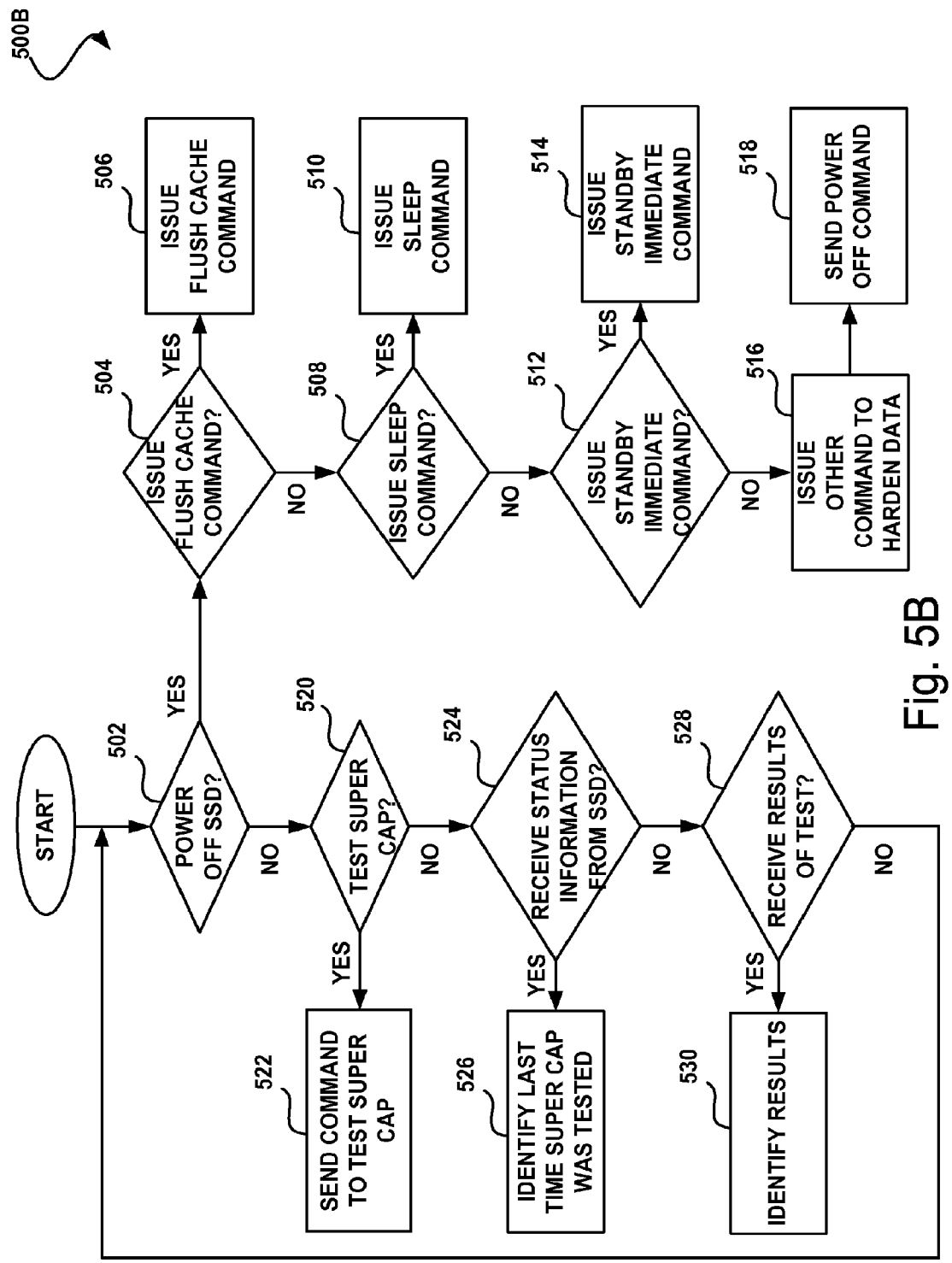
FIG. 5B illustrates selected details of another embodiment for hardening data stored on an SSD.

FIG. 5B illustrates selected details of another embodiment 500B for hardening data stored on an SSD. As shown, it is determined whether a command to power off a solid state disk is received. See operation 502. In one embodiment, it may be determined that the solid state disk is to be powered off as part of power cycling. For example, the power cycling may be a result of an error recovery.

If a command is received to power off the solid state disk, it is determined whether to issue a flush cache command. See operation 504. If it is determined to issue a flush cache command, the flush cache command is issued. See operation 506. In one embodiment, a bridge may issue the flush cache command.

It is further determined whether to issue a sleep command. See operation 508. If it is determined to issue a sleep command, the sleep command is issued. See operation 510. In one embodiment, a bridge may issue the sleep command.

Additionally, it is determined whether to issue a standby immediate command. See operation 512. If it is determined to issue a standby immediate command, the standby immediate command is issued. See operation 514. Again, in one embodiment, a bridge may issue the standby immediate command.

If it is determined that a flush cache command, a sleep command, and a standby immediate command are not to be issued, another data hardening command is issued before powering off the solid state disk. See operation 516. Once the data hardening command is issued, a power off or power cycle command is sent. See operation 518.

It should be noted that by issuing a command to harden data (e.g. a flush cache command, a sleep command, a standby immediate command, or some other command, etc.) before powering off the solid state disk may be implemented without a super capacitor or battery. This may be implemented to increased reliability of the solid state disk.

In one embodiment, however, the solid state disk may include a super capacitor or battery. For example, a solid state disk may have a super capacitor or battery so that when power is removed the solid state disk may flush all the data out to flash without losing data. In this case, an initiator or bridge may send a command to a solid state disk to test the super capacitor or battery. Additionally, a solid state disk may return status about the last time the super capacitor or battery was tested.

Thus, in addition to determining whether a power off command is received for the solid state disk, in one embodiment, it may be determined whether to send a command to test one of a super capacitor or battery associated with the solid state disk. See operation 520. If it is determined to test the super capacitor or battery, the command to test the super capacitor or battery associated with the solid state disk is sent. See operation 522.

In one embodiment, the command to test the super capacitor or battery associated with the solid state disk may be sent by an initiator. In another embodiment, the command to test the super capacitor or battery associated with the solid state disk may be sent by a bridge.

It may also be determined if any information is received from the solid state disk. The information may include any type of information. For example, in one embodiment, de-allocation status information may be received from the solid state device.

Additionally, it may be determined if information including a status indicating a last time the super capacitor or battery associated with the solid state disk was tested is received. See operation 524. In this case, the solid state disk may send the status indicating the last time the super capacitor or battery associated with the solid state disk was tested.

Using this information, the last time the super capacitor or battery was tested may be identified. See operation 526. Based on this identification, it may further be determined that a test of the super capacitor or battery should initiated.

In addition to determining if a status of the super capacitor or battery was received, it may also be determined if results of a super capacitor or battery test are received. See operation 528. If results of the test are received, the results are identified. See operation 530.

In this case, the results of the test may indicate a success or failure of the test of the super capacitor or buttery. Based on these results, it may be determined that another test of the super capacitor or battery should be initiated. In this way, the status of a super capacitor or battery may be determined and it may be determined whether to test the super capacitor or battery.

Figure 5C:
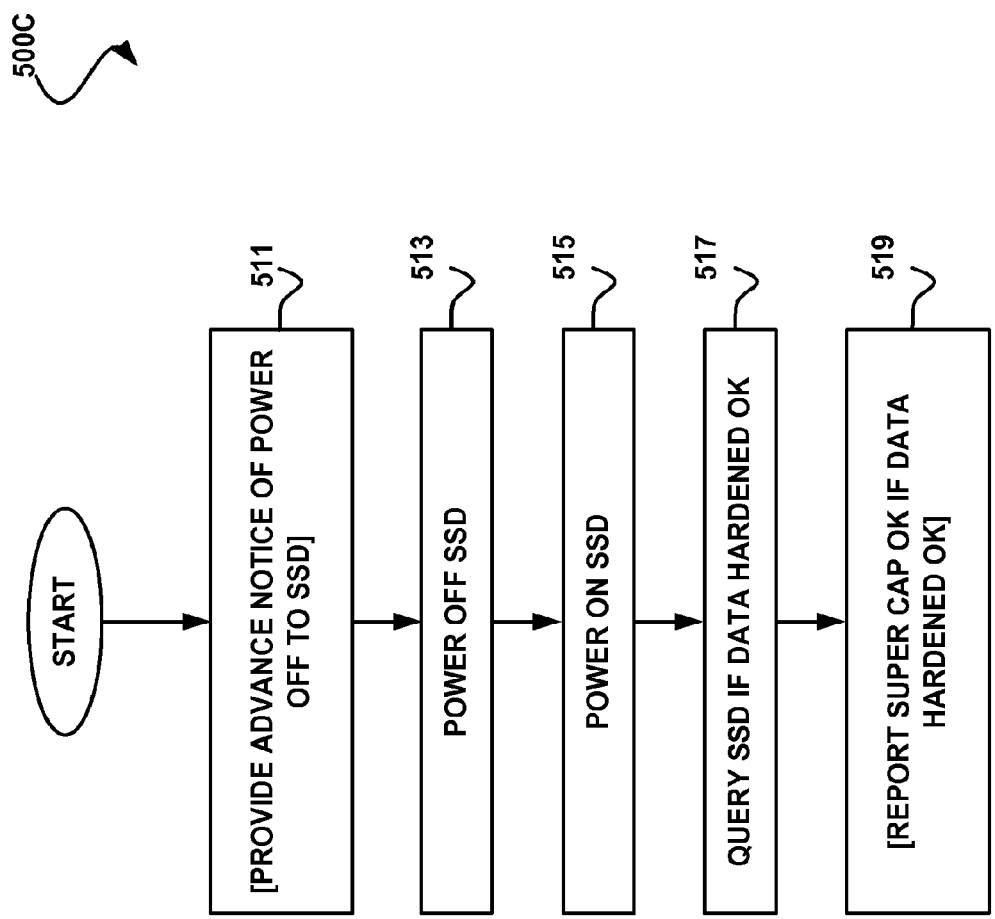
FIG. 5C illustrates selected details of an embodiment for testing a super capacitor or battery of an SSD.

FIG. 5C illustrates selected details of an embodiment 500C for testing a super capacitor or battery of an SSD. In operation, an SSD is optionally provided with advance notice that it will be powered off. See operation 511. Then the SSD is powered off. See operation 513. Subsequently she SSD is powered on. See operation 515. The SSD is then queried as to whether or not data was hardened correctly. See operation 517. If the data was hardened correctly, then optionally a report is made that a super capacitor or battery of the SSD is operational. See operation 519.

In various embodiments, one or more of the operations (f the figure are performed by or under control of a bridge (such as any of bridges 106 of FIG. 1), an expander (such as any of expanders 104 of FIG. 1 or expanders 204 of FIG. 2), and/or an initiator (such as any of initiators 102 of FIG. 1 or initiators 202 of FIG. 2). In various embodiments, the SSD referred to in the figure corresponds to a SATA drive or a SAS drive, having an ESD (such as a super capacitor) included therein or coupled thereto. For example, the SSD is included in one or more memory devices 108 of FIG. 1 and the super capacitor is included in one or more super capacitors 110. For another example, the SSD is included in one or more memory devices 208 of FIG. 2 and the super capacitor is included in one or more super capacitors 210.

In various embodiments, all or any portion of the operations described with respect to FIG. 3A, FIG. 3B, FIG. 4A, FIG. 4B, FIG. 5A, and/or FIG. 5B are implemented by any one or more of all or any portion of the elements in FIG. 1, FIG. 2, and/or described variants thereof. For example, operations 301 and 303 of FIG. 3A are implemented by bridges 106 of FIG. 1, or alternatively by one or more memory devices 208 of FIG. 2. For another example, operation 312 of FIG. 3B is implemented by bridges 106 of FIG. 1, or alternatively by one or more memory devices 208 of FIG. 2. For yet another example, operations 401 and 403 of FIG. 4A are implemented by one or more memory devices 108 of FIG. 1, or alternatively one or more memory devices 208 of FIG. 2. For yet another example, operations 412 and 414 of FIG. 4B are implemented by one or more memory devices 108 of FIG. 1, or alternatively one or more memory devices 208 of FIG. 2. For yet another example, operation 501 of FIG. 5A and operation 522 of FIG. 5B are implemented by bridges 106 of FIG. 1, or alternatively by one or more memory devices 208 of FIG. 2.

Figure 6:
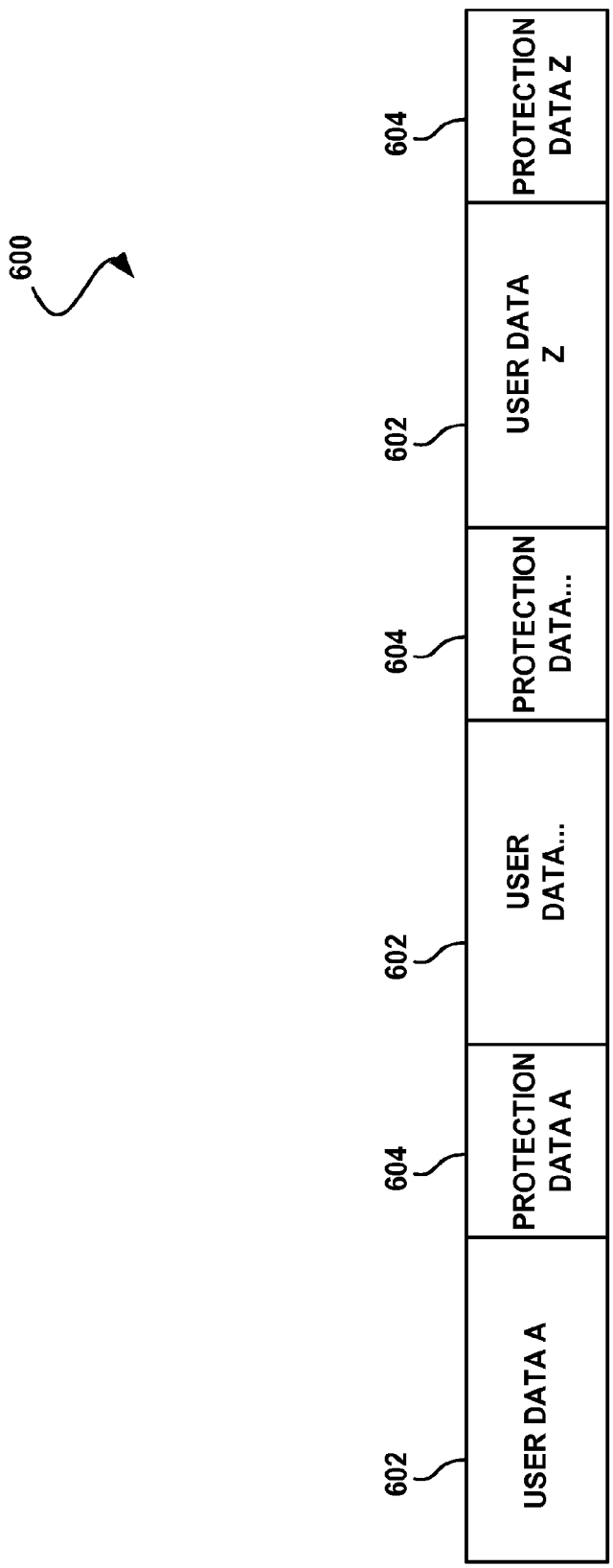
FIG. 6 illustrates selected details of an embodiment of all or any portion of an LBA sector for storing user data and protection data.

FIG. 6 illustrates selected details of an embodiment 600 of all or any portion of an LBA sector for storing user data and protection data. As shown, the LBA sector may store user data 602 and protection data 604 separately. This may be implemented such that the user data 602 or the protection data 604 may be operated on separately, without disturbing the data that is not included in the operation. In one embodiment, the LBA sector may include multiple user data and/or protection fields.

Figure 7:
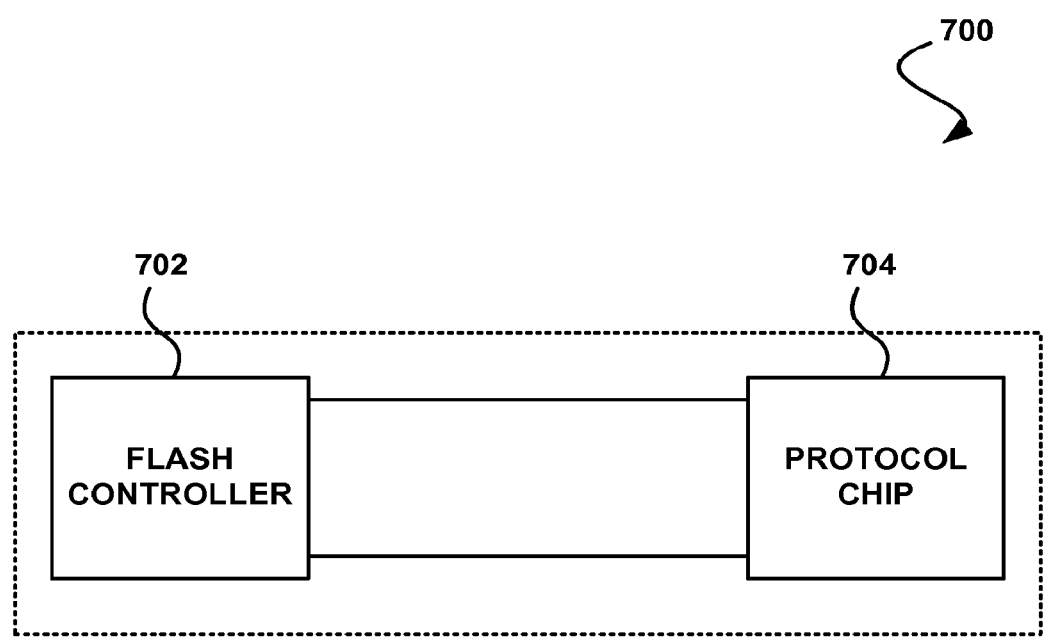
FIG. 7 illustrates selected details of an embodiment for sending LBA de-allocation status information, in accordance with another embodiment.

FIG. 7 illustrates selected details of an embodiment for sending LBA de-allocation status information, in accordance with another embodiment 700. As shown, the system 700 includes one or more blocks or chips 702-704. In a configuration where there are two blocks or two chips, where one of these is a protocol engine/buffer on a chip and the other is a flash controller, the de-allocation process and read data may be implemented in a controlled fashion. This may be accomplished in a variety of ways.

For example, in one embodiment, the flash controller 702 may send data for UNMAPPED LBAs to a protocol buffer associated with the protocol chip 704. In this case, however, the protocol buffer may need to simulate certain characteristics because the buffer may not have any knowledge that the LBA is trimmed. Additionally, in this case, a VERIFY command with a BYTE CHK=1 may not be implemented properly. As an option, a constant field in the flash controller 702 may be utilized.

In another embodiment, the flash controller 702 may report to the protocol chip 704 or protocol buffer that the LBA is de-allocated. On reads, the protocol buffer may then need to generate the data. This may allow more flexibility for the protection field as the protocol buffer may have more hooks to generate this information. This also may offer more flexibility for protection techniques, other than data integrity field (DIF) protection. When random data is in the protection fields, other techniques may be implemented as this may allow for the VERIFY command with BYTE CHK=1 to generate a CHECK condition.

In yet another embodiment, the flash controller 702 may have two independent pieces of data in a block. For example, it may have user data and protection data. If the user data and protection data are read, written, and/or de-allocated independently, then any protection scheme may be supported. Additionally, most techniques of FOR MAT and WRITE SAME commands may be supported. Table 10 shows options that may be supported, in accordance with one embodiment.

TABLE 10

| Function | User Data | Protection Data |
| --- | --- | --- |
| De-Allocate | X | |
| De-Allocate | X | X |
| De-Allocate | | X |
| Information Read | X | X |
| Information Read | Reported as De-allocated | X |
| Information Read | Reported as De-allocated | Reported as De-allocated |
| Information Read | X | Protection not supported |

TABLE 10-continued

| Function | User Data | Protection Data |
| --- | --- | --- |
| Information Written | X | X |
| Information Written | X | Protection not supported |
| Information Written | De-allocated | X |
| Status of de-allocation | X | X |

Thus, using the system 700, the flash controller 702 may return information to the protocol chip 704, a block, or a protocol based buffer that a block or pieces of a block is unmapped. Additionally, the flash controller 702 may return information to the protocol chip 704, block, or a protocol based buffer that a block or pieces of a block is unmapped, instead of data. Still yet, the flash controller 702 may return part of a block to the protocol chip 704, block, or a protocol based buffer that part of the data in a block is unmapped and return data for the part of the data that is mapped.

As noted above, in one embodiment, the flash controller may receive a command or other data that queries the status of a block to determine if it is mapped. This command or other query may optionally include parameters and may not requite the data in the block to be provided to the querying device. This is different than a read verify with a byte chock equal to 1 as this may require the initiator to provide the data for the block. Furthermore, storing the user data and protection data separately may allow for read commands that do not use protection to operate without disturbing the protection data.

SSD Controller

Figure 8A:
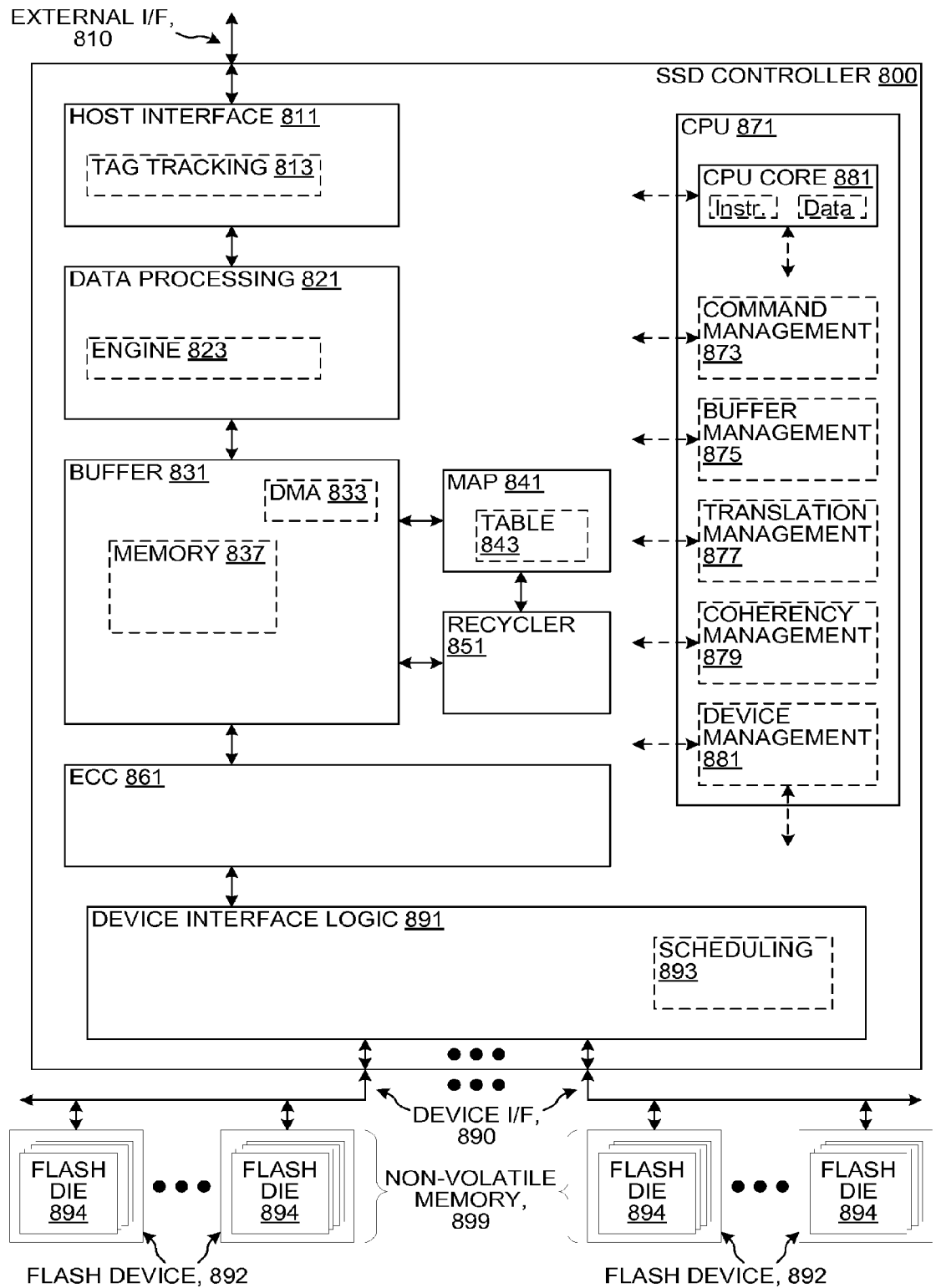
FIG. 8A illustrates selected detail, of an embodiment of an SSD including an SSD controller using mapping for accusing and controlling non-volatile memories.

FIG. 8A illustrates selected details of an embodiment of an SSD including an SSD controller using mapping for accessing and controlling non-volatile memories. SSD controller 800 is communicatively coupled via one or more external interfaces 810 to a host (not illustrated). According to various embodiments, external interfaces 810 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD controller 800 includes a SATA interface and a PCIe interface.

SSD controller 800 is further communicatively coupled via one or more device interfaces 890 to non-volatile memory 899 including one or more storage devices, such as flash devices 892. According to various embodiments, device interfaces 890 are one or more of: an asynchronous interface; a synchronous interface; a DDR synchronous interface; an ONFI compatible interface, such as an ONFI 2.2 compatible interface; a Toggle-mode compatible flash interface; a non-standard version of any of the preceding interfaces; a custom interface; or any other type of interface used to connect to storage devices.

Flash devices 892 have, in some embodiments, one or more individual flash die 894. According to type of a particular one of flash devices 892, a plurality of flash die 894 in the particular flash device 892 are optionally and/or selectively accessible in parallel. Flash devices 892 are merely representative of one type of storage device enabled to communicatively couple to SSD controller 800. In various embodiments, any type of storage device is usable, such as an SLC NAND flash memory, MLC NAND flash memory, NOR flash memory, read-only memory, static random access memory, dynamic random access memory, ferromagnetic memory, phase-change memory, racetrack memory, or any other type of memory device or storage medium.

According to various embodiments, device interfaces 890 are organized as: one or more busses with one or more flash devices 892 per bus; one or more groups of busses with one or more flash devices 892 per bus, where busses min a group are generally accessed in parallel; or any other organization of flash devices 892 onto device interfaces 890.

Continuing in FIG. 8A. SSD controller 800 has one or more modules, such as host interface 811, data processing 821, buffer 831, map 841, recycler 851, ECC 861, device interface logic 891, and CPU 871. The specific modules and interconnections illustrated in FIG. 8A are merely representative of one embodiment, and many arrangements and interconnections of some or all of the modules, as well as additional modules not illustrated, are conceived. In a first example, in some embodiments, there are two or more host interfaces 811 to provide dual-porting. In a second example, in some embodiments, data processing 821 and/or ECC 861 are combined with buffer 831. In a third example, in some embodiments, host interfaces 811 is directly coupled to buffer 831, and data processing 821 optionally and/or selectively operates on data stored in buffer 831. In a fourth example, in some embodiments, device interface logic 891 is directly coupled to buffer 831, and ECC 861 optionally and/or selectively operates on data stored in buffer 831.

Host interface 811 sends and receives commands and/or data via external interface 810, and, in some embodiments, tracks progress of individual commands via tag tracking 813. For example, the commands include a read command specifying an address (such as an LBA) and an amount of data (such as a number of LBA quanta, e.g. sectors) to read; in response the SSD provides read status and/or read data. For another example, the commands include a write command specifying an address (such as an LBA) and an amount of data (such as a number of LBA quanta, e.g. sectors) to write; in response the SSD provides write status and/or requests write data and optionally subsequently provides write status. For yet another example, the commands include a de-allocation command specifying an address (such as an LBA) that no longer need be allocated; in response the SSD modifies the map accordingly and optionally provides de-allocation status. For yet another example, the commands include a super capacitor test command or a data hardening success query; in response, the SSD provides appropriate status. In some embodiments, host interface 811 is compatible with the SATA protocol and, using NCQ commands, as enabled to have up to 32 pending commands, each with a unique tag represented as a number from 0 to 31. In some embodiments, tag tracking 813 is enabled to associate at external tag for a command received via external interface 810 with an internal tag used to track the command during processing by SSD controller 800.

According to various embodiments, one or more of: data processing 821 optionally and/or selectively processes some or all data sent between buffer 831 and external interfaces 810; and Data processing 821 optionally and/or selectively processes data stored in buffer 831. In some embodiments, data processing 821 uses one or more engines 823 to perform one or more of: formatting; reformatting; transcoding; and any other data processing and/or manipulation task.

Buffer 831 stores data sent to/from external interfaces 810 from/to device interfaces 890. In some embodiments, buffer 831 additionally stores system data, such as some or all map tables, used by SSD controller 800 to manage flash devices 892. In various embodiments, buffer 831 has one or more of: memory 837 used for temporary storage of data; DMA 833 used to control movement of data to and/or from buffer 831; and other data movement and/or manipulation functions.

According to various embodiments, one or more of: ECC 861 optionally and/or selectively processes some or all data sent between buffer 831 and device interfaces 890; and ECC 861 optionally and/or selectively processes data stored in buffer 831.

Device interface logic 891 controls flash devices 892 via device interfaces 890. Device interface logic 891 is enabled to send data to/from flash devices 892 according to a protocol of flash devices 892. Device interface logic 891 includes scheduling 893 to selectively sequence control of flash devices 892 via device interfaces 890. For example, in some embodiments, scheduling 893 is enabled to queue operations to flash devices 892, and to selectively send the operations to individual ones of flash devices 892 (or flash die 894) as individual flash devices 892 (or flash die 894) are available.

Map 841 converts between data addressing used on external interfaces 810 and data addressing used on device interfaces 890, using table 843 to map external data addresses to locations in non-volatile memory 899. For example, in some embodiments, map 841 converts LBAs used on external interfaces 810 to block and/or page addresses targeting one or more flash die 894, via mapping provided by table 843. For LBAs that have never been written since drive manufacture or de-allocation, the map points to a default value to return if the LBAs are read. For example, when processing a de-allocation command, the map is modified so that entries corresponding to the de-allocated LBAs point to one of the default values. In various embodiments, there are a plurality of default values, each having a corresponding pointer. The plurality of default values enables reading some de-allocated LBAs (such as in a first range) as one default value, while reading other de-allocated LBAs (such as in a second range) as another default value. The default values, in various embodiments, are defined by flash memory, hardware, firmware, command/primitive arguments/parameters, programmable registers, or various combinations thereof.

In some embodiments, recycler 851 performs garbage collection. For example, in some embodiments, flash devices 892 contain blocks that must be erased before the blocks are re-writeable. Recycler 851 is enabled to determine which portions of flash devices 892 are actively in use (e.g. allocated instead of de-allocated), such as by scanning a map maintained by map 841, and to make unused (e.g. de-allocated) portions of flash devices 892 available for writing by erasing them. In further embodiments, recycler 851 is enabled to move data stored within flash devices 892 to make larger contiguous portions of flash devices 892 available for writing.

CPU 871 controls various portions of SSD controller 800. CPU 871 includes CPU core 881. CPU core 881 is, according to various embodiments, one or more single-core or multi-core processors. The individual processors cores in CPU core 881 are, in some embodiments, multi-threaded. CPU core 881 includes instruction and/or data caches and/or memories. For example, the instruction memory contains instructions to enable CPU core 881 to execute software (sometimes called firmware) to control SSD controller 800. In some embodiments, some or all of the firmware executed by CPU core 881 is stored on flash devices 892.

In various embodiments. CPU core 871 further includes: command management to track and control commands received via external interfaces 810 while the commands are in progress; buffer management 875 to control allocation and use of buffer 831; translation management 877 to control map 841; coherency management 879 to control consistency of data addressing and to avoid conflicts such as between external data accesses and recycle data accesses; device management 881 to control device interface logic 891; and optionally other management units. None, any, or all of the management functions performed by CPU 871 are, according to various embodiments, controlled and/or managed by hardware, by software (such as software executing on CPU core 881 or on a host connected via external interfaces 810), or any combination thereof.

In some embodiments, CPU core 871 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD controller 800 and is compatible with operation with various computing hosts, such as via adaptation of host interface 811 and/or external interface 810. The various computing hosts include one or any combination of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game.

In some embodiments, system 700 of FIG. 7 corresponds to an implementation of all or any portion of SSD controller 800. In some embodiments, all or any portion of flash controller 702 and/or protocol chip 704 of FIG. 7 are implemented via elements similar to those of SSD controller 800.

In various embodiments, all or any portion of an SSD controller (or a computing-host flash memory controller) are implemented on a single IC, a single die of a multi-die IC, a plurality of dice of a multi-die IC, or a plurality of ICs. For example, buffer 831 is implemented on a same die as other elements of SSD controller 800. For another example, buffer 831 is implemented on a different die than other elements of SSD controller 800.

Figure 8B:
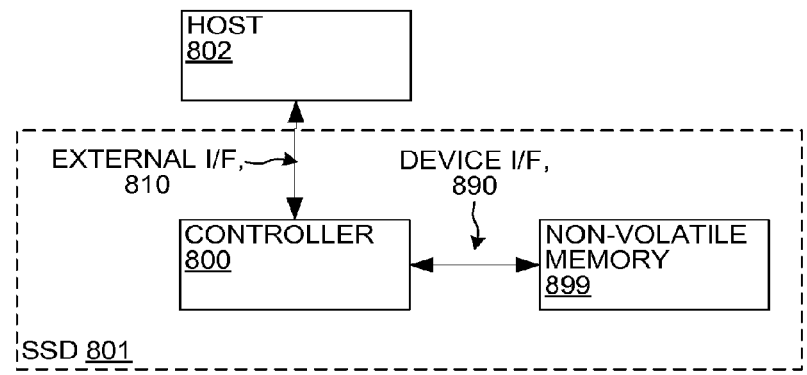
FIG. 8B illustrates selected details of an embodiment of a system including the SSD of FIG. 8A.

FIG. 8B illustrates selected details of an embodiment of a system including the SSD of FIG. 8A. SSD 801 includes SSD controller 800 coupled to non-volatile memory 899 via device interfaces 890. The SSD is coupled to host 802 via external interfaces 810. In some embodiments, SSD 801 (or variations thereof) corresponds to a SAS drive or a SATA drive that is coupled to an initiator operating as host 802.

Figure 8C:
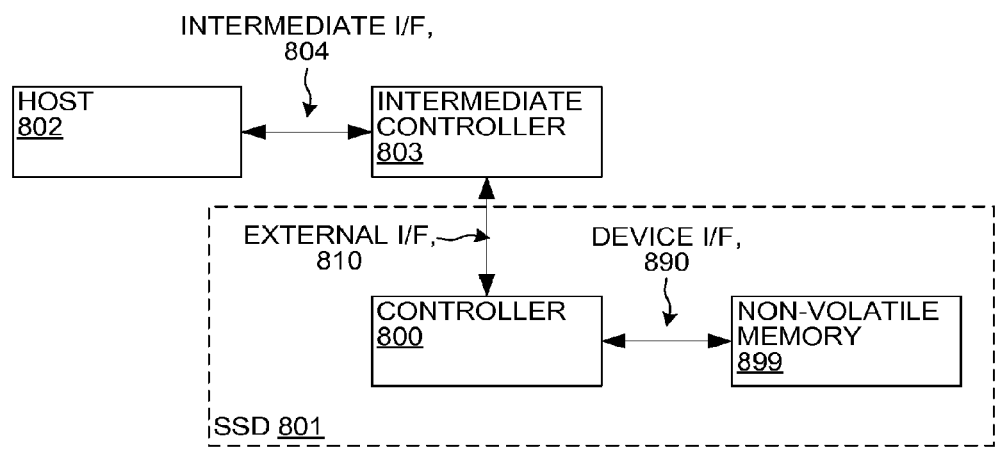
FIG. 8C illustrates selected details of an embodiment of a system including the SSD of FIG. A.

FIG. 8C illustrates selected details of an embodiment of a system including the SSD of FIG. 8A. As in FIG. 8B, SSD 801 includes SSD controller 800 coupled to non-volatile memory 899 via device interfaces 890. The SSD is coupled to host 802 via external interfaces 810 in turn coupled to intermediate controller 803 and then to host 802 via intermediate interfaces 804. In various embodiments. SSD controller 800 is coupled to the host via one or more intermediate levels of other controllers, such as a RAID controller. In some embodiments. SSD 801 (or variations thereof) corresponds to a SAS drive or a SATA drive and intermediate controller 803 corresponds to an expander that is in turn coupled an initiator, or alternatively intermediate controller 803 corresponds to a bridge that is indirectly coupled to an initiator via an expander.

In various embodiments, an SSD controller and/or a computing-host controller in combination with one or more non-volatile memories are implemented as a non-volatile storage component, such as a USB storage component, a CF storage component, an MMC storage component, an SD storage component, a Memory Stick storage component, and an xD-picture card storage component.

Other Information

In various embodiments, a power-loss detection circuit, a power-loss status detector, a power down command receiver/decoder, or any combination thereof are included in any convenient element of an SSD controller, and provide a request to harden data. For example, a power down command receiver/decoder is included in one or more external interfaces 810 of FIG. 8A and is enabled to receive and decode a power down command from a computing and/or an interfacing host coupled to the external interfaces.

Figure 9:
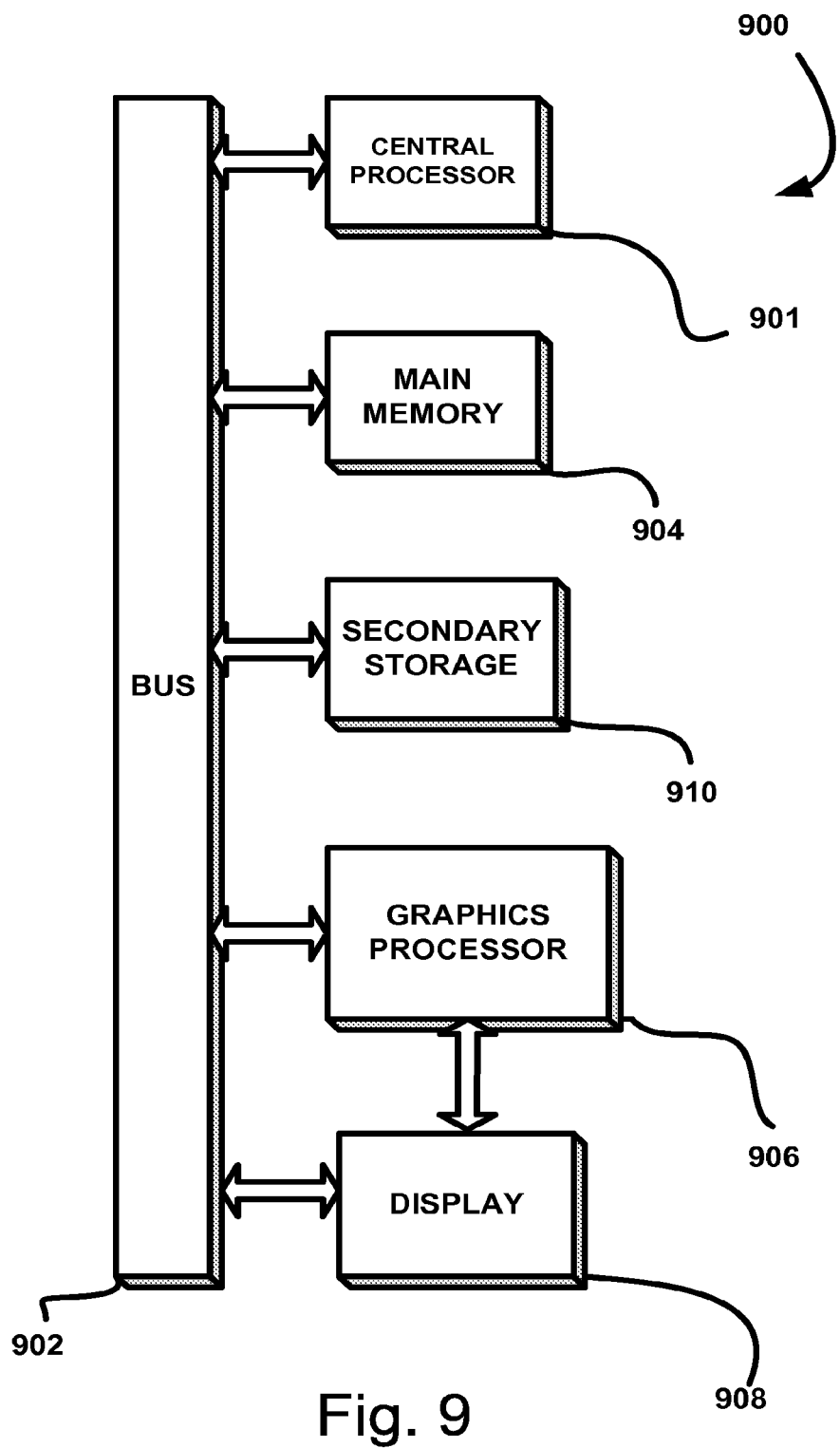
FIG. 9 illustrates an exemplary system in which the various architecture and/or functionality the various previous embodiments may be implemented.

FIG. 9 illustrates an exemplary system 800 in which the various architecture and/or functionality of the various previous embodiments may be implemented. As shown, a system 800 is provided including at least one host processor 801 that is connected to a communication bus 802. The system 800 also includes a main memory 804. Control logic (software) and data are stored in the main memory 804 which may take the form of random access memory (RAM).

The system 800 also includes a graphics processor 806 and a display 808, i.e. a computer monitor. In one embodiment, the graphics processor 806 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 800 may also include a secondary storage 810. The secondary storage 810 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 804 and/or the secondary storage 810. Such computer programs, when executed, enable the system 800 to perform various functions. Memory 804, storage 810 and/or any other storage are possible examples of computer-readable media.

In one embodiment, the architecture and/or functionality of the various previous figures may be implemented in the context of the host processor 801, graphics processor 806, an integrated circuit (not shown) that is capable of at least a portion of the capabilities of both the host processor 801 and the graphics processor 806, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 800 may take the form of a desktop computer, lap-top computer, and/or any other type of logic. Still yet, the system 800 may take the form of various other devices including, but not limited to, a personal digital assistant (PDA) device, a mobile phone device, a television, etc.

Further, while not shown, the system 800 may be coupled to a network [e.g. a telecommunications network, local area network (LAN), wireless network, wide area network (WAN) such as the Internet, peer-to-peer network, cable network, etc.] for communication purposes.

Example Implementation Techniques

In some embodiments, various combinations of all or portions of operations performed by a computing-host flash memory controller or an SSD controller (such as SSD controller 800 of FIG. 8A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE. SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments some, all, or various portions of the program instructions are realized as one or more functions, routines, sub-routines, in-line routines, procedures, macros, or portions thereof.

CONCLUSION

Certain choices have been made in the description merely for convenience in preparing the text and drawings and unless there is an indication to the contrary the choices should not be construed per sc as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flow-chart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
   receiving, at a storage device, power loss information in a first format associated with a first protocol; and
   converting, at the storage device, the power loss information in the first format to a second format associated with a second protocol, wherein converting the power loss information in the first format to the second format comprises converting one of a power loss primitive or a power loss command to one of a primitive or command for hardening data.

2. The method of claim 1, wherein the first protocol includes a Small Computer System Interface (SCSI) protocol and the second protocol includes an ATA Attachment (ATA) protocol.

3. The method of claim 2, wherein converting the power loss information in the first format to the second format includes converting an SCSI power loss primitive to an ATA flush cache command.

4. The method of claim 1, wherein the primitive or command for hardening data comprises one or more of a flush cache command, a sleep command, and a standby intermediate command.

5. The method of claim 1, wherein the power loss information is received by a bridge of the storage device and wherein the power loss information is converted in the bridge.

6. The method of claim 1, wherein the power loss information is received by a storage controller of the storage device and wherein the power loss information is converted in the storage controller.

7. The method of claim 1, further comprising:
   hardening data stored on a storage device responsive to the converted primitive or command for hardening data.

8. The method of claim 7, wherein the hardening comprises writing information in a volatile memory to a non-volatile memory of the storage device.

9. The method of claim 1, wherein converting the power loss information further comprises converting the power loss primitive to a sleep command.

10. The method of claim 1, wherein converting the power loss information further comprises converting the power loss primitive to a standby immediate command.

11. The method of claim 1, wherein the storage device comprises a solid state disk.

12. A storage device, comprising:
    a bridge for receiving power loss information in a first format associated with a first protocol and for converting the power loss information in the first format to a second format associated with a second protocol, wherein converting the power loss information in the first format to the second format includes the bridge converting one of a power loss primitive or a power loss command to one of a primitive or command for hardening data; and
    a non-volatile memory, the storage device to harden on the non-volatile memory responsive to the converted primitive or command for hardening data.

13. The storage device of claim 12, wherein the bridge comprises a Serial Attached SCSI (SAS) bridge.

14. The storage device of claim 12, wherein the bridge comprises a Serial ATA (SATA) bridge.

15. The storage device of claim 12, wherein the storage device comprises a solid state disk.

16. A non-transitory computer readable medium having a set of instructions stored therein which when executed by a processing device causes the processing device to:
    receive power loss information in a first format associated with a first protocol;
    convert the power loss information in the first format to a second format associated with a second protocol, wherein converting the power loss information in the first format to the second format comprises converting one of a power loss primitive or a power loss command to one of a primitive or command for hardening data; and
    harden data stored on a storage device responsive to the converted primitive or command for hardening data.

17. The non-transitory computer readable medium of claim 16, wherein the hardening comprises writing information in volatile memory to non-volatile memory of the storage device.

18. The non-transitory computer readable medium of claim 16, wherein the data that is hardened comprises user data and protection data.

19. The non-transitory computer readable medium of claim 16, wherein the storage device comprises a solid state disk.

20. The non-transitory computer readable medium of claim 16, wherein the processing device is caused to receive the power loss information, convert the power loss information, and harden the data via an intermediate controller, the intermediate controller comprising one of a group selected from a bridge and a RAID controller.

* * * * *